United States Patent
Nakata

(10) Patent No.: US 12,165,552 B2
(45) Date of Patent: Dec. 10, 2024

(54) ELECTRONIC APPARATUS

(71) Applicant: Sony Semiconductor Solutions Corporation, Kanagawa (JP)

(72) Inventor: Masashi Nakata, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 205 days.

(21) Appl. No.: 17/790,785

(22) PCT Filed: Jan. 7, 2021

(86) PCT No.: PCT/JP2021/000399
§ 371 (c)(1),
(2) Date: Jul. 5, 2022

(87) PCT Pub. No.: WO2021/149503
PCT Pub. Date: Jul. 29, 2021

(65) Prior Publication Data
US 2023/0042435 A1    Feb. 9, 2023

(30) Foreign Application Priority Data

Jan. 22, 2020 (JP) ................. 2020-008524

(51) Int. Cl.
G09G 3/20     (2006.01)
G06T 5/77     (2024.01)
G06T 7/00     (2017.01)

(52) U.S. Cl.
CPC ............... *G09G 3/20* (2013.01); *G06T 5/77* (2024.01); *G06T 7/0004* (2013.01); *G06T 2207/30168* (2013.01); *G09G 2320/0693* (2013.01)

(58) Field of Classification Search
CPC .... G09G 3/20; G09G 2320/0693; G06T 5/77; G06T 7/0004; G06T 2207/30168;
(Continued)

(56) References Cited

U.S. PATENT DOCUMENTS

2015/0288867 A1   10/2015   Kajimura
2018/0069060 A1    3/2018   Rappoport et al.
(Continued)

FOREIGN PATENT DOCUMENTS

CN    102648405 A    8/2012
CN    110044931 A    7/2019
(Continued)

OTHER PUBLICATIONS

Written Opinion of the International Searching Authority (PCT/ISA/237), International Application No. PCT/JP2021/000399, dated Mar. 30, 2021. (Year: 2021).*
(Continued)

*Primary Examiner* — Jeffery A Brier
(74) *Attorney, Agent, or Firm* — Michael Best & Friedrich LLP

(57) ABSTRACT

The present disclosure provides an electronic apparatus capable of capturing an image without being affected by an abnormality on a display surface.
The electronic apparatus includes: a display unit; an imaging unit that is disposed on an opposite side to a display surface of the display unit; an abnormality detection unit that detects an abnormality on the display surface; and a display control unit that highlights a position where the abnormality detected by the abnormality detection unit occurs on the display unit.

20 Claims, 20 Drawing Sheets

(58) Field of Classification Search
CPC ... G06T 5/73; G06T 5/80; G06T 2207/20081; G06T 2207/30108; G06T 5/00; G06T 7/70; H01L 27/14625; H04N 23/57; H04N 23/672; H04N 23/73; H04N 23/811; H04N 23/633; H04N 23/63; H04N 25/671; H04M 1/0266; H04M 1/72454; H04M 1/0264
See application file for complete search history.

(56) References Cited

U.S. PATENT DOCUMENTS

| | | | | |
|---|---|---|---|---|
| 2020/0358930 | A1* | 11/2020 | Nicholson | G06F 3/04812 |
| 2020/0358937 | A1* | 11/2020 | Nicholson | H04N 23/64 |

FOREIGN PATENT DOCUMENTS

| | | | | |
|---|---|---|---|---|
| JP | 2004153422 | A | | 5/2004 |
| JP | 2004317377 | A | | 11/2004 |
| JP | 2006338122 | A | * | 12/2006 |
| JP | 2010130549 | A | | 6/2010 |
| JP | 2011044094 | A | | 3/2011 |
| JP | 2013057570 | A | | 3/2013 |
| WO | WO-2017002715 | A1 | | 1/2017 |

OTHER PUBLICATIONS

International Preliminary Report on Patentability (PCT/IB/373), International Application No. PCT/JP2021/000399, dated Jul. 26, 2022. (Year: 2022).*
International Search Report (PCT/ISA/210), International Application No. PCT/JP2021/000399, dated Mar. 30, 2021.

* cited by examiner

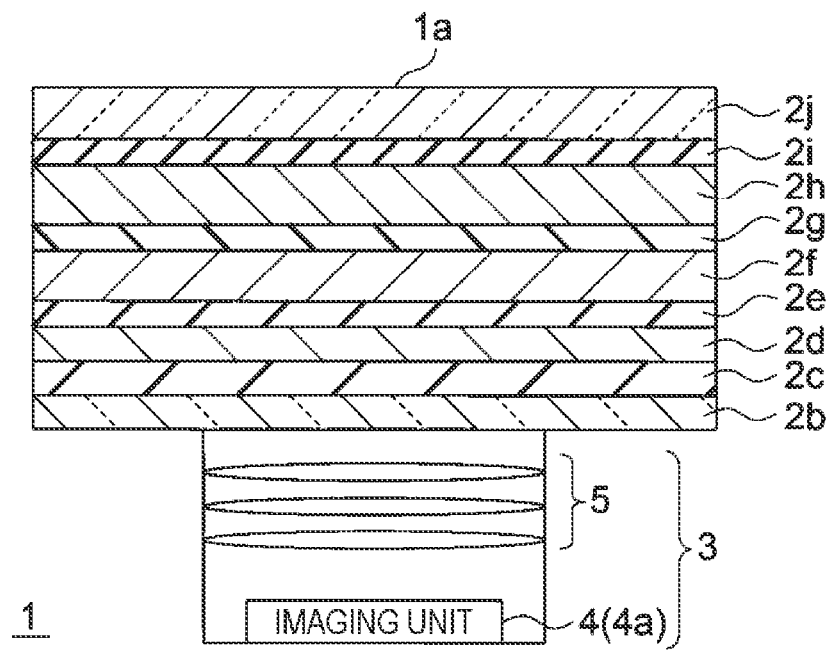
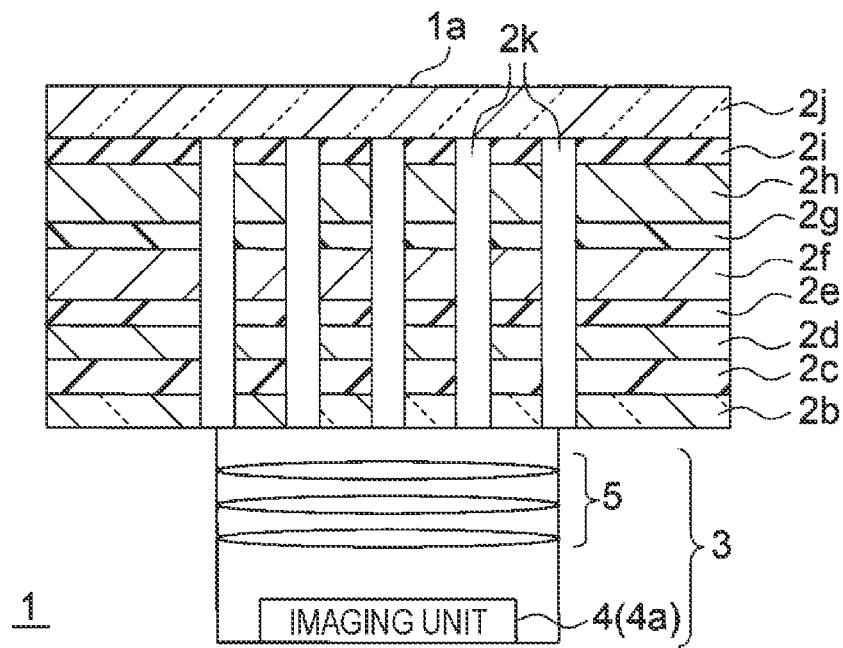

(a)　　　(b)

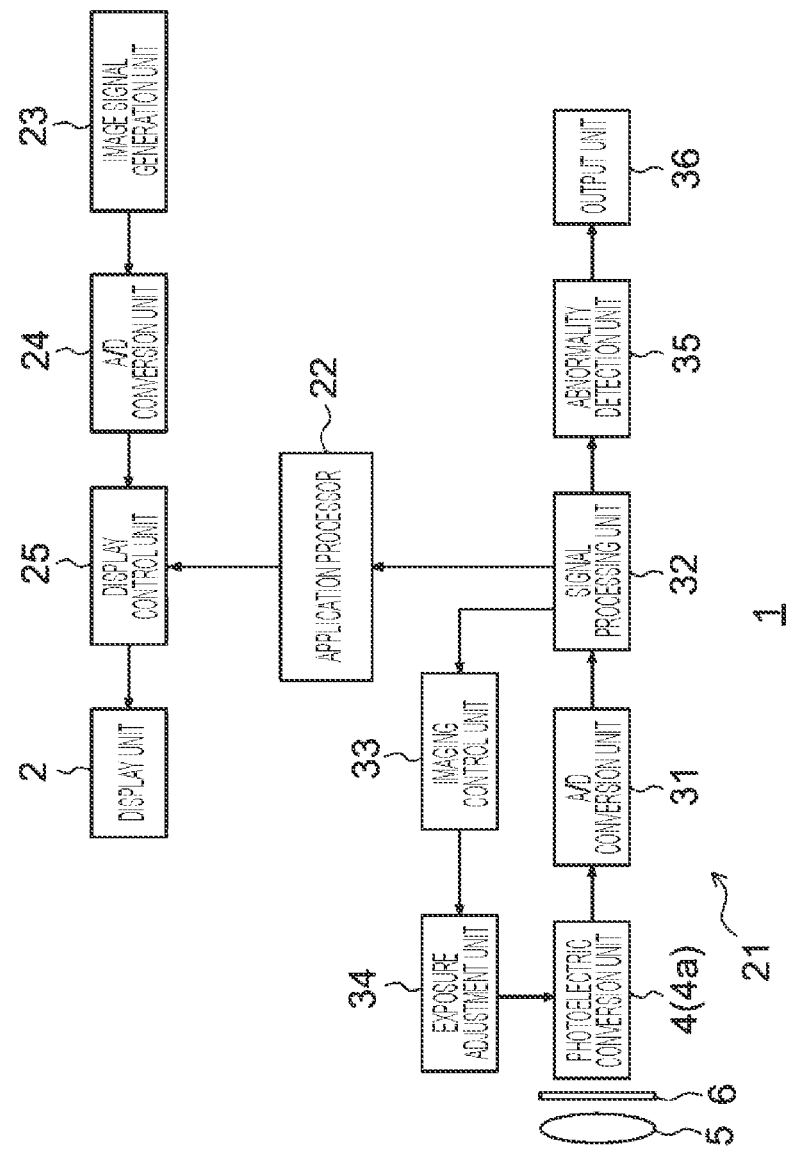

ELECTRONIC APPARATUS

TECHNICAL FIELD

The present disclosure relates to an electronic apparatus.

BACKGROUND ART

In recent electronic apparatuses such as a smartphone, a mobile phone, and a personal computer (PC), various sensors such as cameras are mounted on a frame (bezel) of a display unit. On the other hand, there is a demand for making the external size of the electronic apparatuses as compact as possible without affecting a screen size, and a bezel width tends to be decreased. In view of such a background, a technique has been proposed in which a camera module is disposed immediately below a display unit, and an image of object light having passed through the display unit is captured by a camera.

CITATION LIST

Patent Document

Patent Literature 1: US 2018/0,069,060 A

SUMMARY OF THE INVENTION

Problems to be Solved by the Invention

A touch sensor is built in a display unit of a smartphone or the like, and a fingerprint, hand oil, or the like often adheres to a display surface. Furthermore, there may be scratches on the display surface or a film for protecting the display surface, or bubbles may be generated between the display surface and the film.

As described above, when an image is captured through the display unit by a camera disposed immediately below the display unit in a state in which there is an abnormality on the display surface, there is a possibility that a foreign substance is shown in the captured image or the foreign substance is in focus, and the image cannot be captured as intended.

The present disclosure provides an electronic apparatus capable of capturing an image without being affected by an abnormality on a display surface.

Solutions to Problems

In order to solve the above problems, according to an aspect of the present disclosure, there is provided an electronic apparatus including:
 a display unit;
 an imaging unit that is disposed on an opposite side to a display surface of the display unit;
 an abnormality detection unit that detects an abnormality on the display surface; and a display control unit that highlights a position where the abnormality detected by the abnormality detection unit occurs on the display unit.

The display control unit may cause the display unit to display information urging removal of the abnormality.

The information may include information corresponding to a type of the abnormality.

The display control unit may cause the display unit to display an indicator indicating the position where the abnormality occurs.

According to another aspect of the present disclosure, there is provided an electronic apparatus including:
 a display unit that is capable of emitting light at a plurality of different emission wavelengths;
 an imaging unit that is disposed on an opposite side to a display surface of the display unit; and
 an abnormality detection unit that detects an abnormality on the display surface on the basis of a plurality of images captured by the imaging unit in a state in which at least a part of the display surface is caused to emit light at each of the plurality of emission wavelengths.

The abnormality detection unit may detect the abnormality on the display surface on the basis of a plurality of images captured by the imaging unit in a state in which a region overlapping with an angle of view of the imaging unit on the display surface is caused to emit light at each of the plurality of light emission wavelengths.

According to still another aspect of the present disclosure, there is provided an electronic apparatus including:
 a display unit;
 an imaging unit that is disposed on an opposite side to a display surface of the display unit;
 an abnormality detection unit that detects an abnormality on the display surface; and
 a correction processing unit that corrects an image captured by the imaging unit on the basis of the abnormality.

The correction processing unit may correct the image captured by the imaging unit on the basis of information regarding at least one of a type of the abnormality, a color of the abnormality, a size of the abnormality, a position of the abnormality, or the number of the abnormalities.

An abnormality determination unit that determines a type of the abnormality may be further provided and
 the correction processing unit may perform correction processing according to the type of the abnormality determined by the abnormality determination unit on the image captured by the imaging unit.

The correction processing may include at least one of edge emphasis processing, distortion correction processing, or scratch correction processing.

A model generation unit that generates a model correcting the image captured by the imaging unit on the basis of information regarding the abnormality may be further provided, the model being trained on the basis of at least one piece of information regarding a type of the abnormality, a color of the abnormality, a size of the abnormality, a position of the abnormality, or the number of the abnormalities, and an image before and after the correction processing unit performs correction, and
 the correction processing unit may correct the image captured by the imaging unit by giving the image captured by the imaging unit and the information regarding the abnormality to the trained model.

There may be further provided:
 a correction determination unit that determines whether or not correction by the correction processing unit is effective;
 an image communication unit that transmits the image captured by the imaging unit and information regarding the abnormality to an information processing apparatus and receives the image corrected by the information processing apparatus in a case where it is determined that the correction by the correction processing unit is not effective; and
 an output unit that outputs the image corrected by the information processing apparatus.

The imaging unit may include a plurality of cameras that captures images at different angles of view, and
the correction processing unit may remove the abnormality from the image captured by the imaging unit on the basis of a plurality of the images captured by the plurality of cameras.
The imaging unit may include
a plurality of photoelectric conversion units that photoelectrically converts light incident through the display unit,
at least one of the plurality of photoelectric conversion units may be capable of detecting phase difference information, and
the abnormality detection unit may detect the abnormality on the basis of the phase difference information.
The imaging unit may include:
a plurality of photoelectric conversion units that photoelectrically converts light incident through the display unit; and
a plurality of polarization elements that is disposed on a light incident side of at least one of the plurality of photoelectric conversion units, and
the abnormality detection unit may detect the abnormality on the basis of polarization information polarized by the plurality of polarization elements and photoelectrically converted by the photoelectric conversion units.
The plurality of polarization elements may include a plurality of types of polarization elements that detects different polarization states.
The imaging unit may include:
a plurality of photoelectric conversion units that photoelectrically converts light incident through the display unit; and
a microlens array that forms an image of object light on the plurality of photoelectric conversion units.
A distance detection unit that detects a distance to an object imaged by the imaging unit may be further provided, and the abnormality detection unit may detect the abnormality on the basis of the distance detected by the distance detection unit.
The imaging unit may include a plurality of cameras that captures images at different angles of view, and
the distance detection unit may detect the distance on the basis of the captured images of the plurality of cameras.
There may be further provided a fingerprint detection unit that detects a fingerprint of a finger brought into contact with the display surface on the basis of an image captured by the imaging unit.

BRIEF DESCRIPTION OF DRAWINGS

FIG. 1A is a schematic cross-sectional view of an electronic apparatus according to a first embodiment.
FIG. 1B is a schematic cross-sectional view of an electronic apparatus in which an opening is added to FIG. 1A.
FIG. 4A is a block diagram illustrating an internal configuration of the electronic apparatus according to the first embodiment.

MODE FOR CARRYING OUT THE INVENTION

Hereinafter, embodiments of an electronic apparatus will be described with reference to the drawings. Main components of the electronic apparatus will be mainly described below, but the electronic apparatus may have components and functions that are not illustrated or described. The following description does not exclude the components and functions that are not illustrated or described.

First Embodiment

FIGS. 1A and 1B are schematic cross-sectional views of an electronic apparatus 1 according to the first embodiment. The electronic apparatus 1 of FIG. 1A is any electronic apparatus 1 having both a display function and an imaging function, such as a smartphone, a mobile phone, a tablet, or a PC. The electronic apparatus 1 of FIG. 1A includes a camera module (imaging unit) 3 disposed on the opposite side of a display surface 1a of a display unit 2. As described above, in the electronic apparatus 1 of FIG. 1A, the camera module is provided on the back side of the display surface 1a of the display unit 2. Therefore, the camera module captures an image through the display unit 2.

Figure 2:
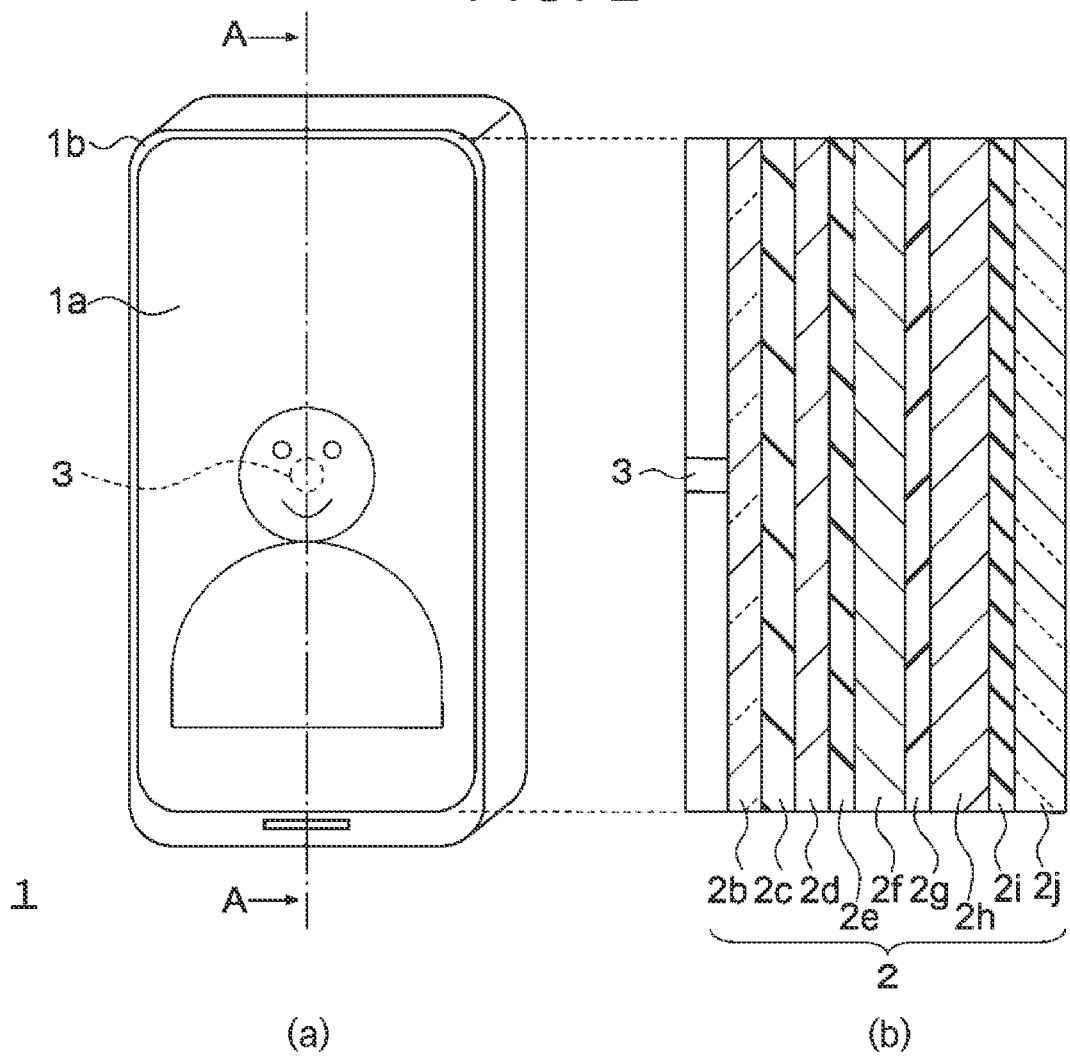
FIG. 2(a) is a schematic external view of the electronic apparatus of FIG. 1A.
FIG. 2(b) is a cross-sectional view taken along line A-A of FIG. 2(a).

FIG. 2(a) is a schematic external view of the electronic apparatus 1 of FIG. 1A, and FIG. 2(b) is a cross-sectional view taken along line A-A of FIG. 2(a). In the example of FIG. 2(a), the display surface 1a extends to the vicinity of the external size of the electronic apparatus 1, and a width of a bezel 1b around the display surface 1a is set to several mm or less. Normally, a front camera is often mounted on the bezel 1b, but in FIG. 2(a), as indicated by a broken line, a camera module 3 functioning as the front camera is disposed on a back surface side of a substantially central portion of the display surface 1a. By providing the front camera on the back surface side of the display surface 1a in this manner, it is not necessary to dispose the front camera on the bezel 1b, and the width of the bezel 1b can be decreased.

Note that, in FIG. 2(a), the camera module 3 is disposed on the back surface side of the substantially central portion of the display surface 1a, but in the present embodiment, the camera module 3 is only required to be disposed on the back surface side of the display surface 1a, for example, the camera module 3 may be disposed on the back surface side near the peripheral edge portion of the display surface 1a. As described above, the camera module 3 in the present embodiment is disposed at an arbitrary position on the back surface side overlapping with the display surface 1a.

As illustrated in FIG. 1A, the display unit 2 is a stacked body obtained by stacking a protective film 2b, a polyimide substrate 2c, a display layer 2d, a barrier layer 2e, a touch sensor layer 2f, an adhesive layer 2g, a circular polarization plate 2h, an optical clear adhesive (OCA) 2i, and a cover glass 2j in this order. The display layer 2d may be, for example, an organic light emitting device (OLED) display layer, a liquid crystal display layer, a MicroLED, or a display layer based on other display principles. The display layer 2d may include a plurality of layers. For example, the display layer 2d may include a color filter layer, a backlight layer, and the like. The display unit 2 performs display using light in a visible light wavelength range, but the light displayed in the display unit 2 may include an infrared light component.

The barrier layer 2e is a layer that prevents oxygen and moisture from entering the display layer 2d. A touch sensor is incorporated in the touch sensor layer 2f. There are various types of touch sensors, such as a capacitive type and a resistive film type, but any type may be adopted. Furthermore, the touch sensor layer 2f and the display layer 2d may be integrated.

The adhesive layer 2g is provided for bonding the circular polarization plate 2h and the touch sensor layer 2f. A material having high visible light transmittance is used for the adhesive layer 2g. The circular polarization plate 2h is provided to reduce glare and increase visibility of the display surface 1a even in a bright environment. The optical clear adhesive 2i is provided to increase adhesion between the circular polarization plate 2h and the cover glass 2j. A material having high visible light transmittance is used as the optical clear adhesive 2i. The cover glass 2j is provided to protect the display layer 2d and the like. Note that the layer configuration of the display unit 2 is not necessarily limited to that illustrated in FIGS. 1A and 2.

The camera module 3 is disposed on the opposite side to the display surface 1a of the display unit 2, that is, on a back side of the display unit 2. The camera module 3 includes an imaging unit 4 and an optical system 5. The optical system 5 is disposed on a light incident surface side of the imaging unit 4, that is, on a side close to the display unit 2, and condenses the light passing through the display unit 2 on the imaging unit 4. The optical system 5 usually includes a plurality of lenses. As described later, there may be a case where a plurality of the camera modules 3 is disposed on the opposite side to the display surface 1a of the display unit 2. In this case, a focal length of the optical system 5 of each of the camera modules 3 may be different from each other such that imaging with a different angle of view such as a wide-angle or a telephoto angle can be performed.

The imaging unit 4 includes a photoelectric conversion unit 4a. The photoelectric conversion unit 4a photoelectrically converts light incident through the display unit 2. The photoelectric conversion unit 4a may be a complementary metal oxide semiconductor (CMOS) sensor or a charge coupled device (CCD) sensor. Furthermore, the photoelectric conversion unit 4a may be a photodiode or an organic photoelectric conversion film.

The photoelectric conversion unit 4a includes a photoelectric conversion element such as a CMOS sensor or the like for each pixel. The pixels can be arranged in any manner. Specifically, the arrangement form of pixels may be a Bayer arrangement, an interline arrangement, a check pattern arrangement, a stripe arrangement, or other arrangements.

As illustrated in FIGS. 1A and 2(b), the electronic apparatus 1 according to the present embodiment is disposed such that the display unit 2 and the camera module 3 overlap with each other in a front and back direction. Therefore, the camera module 3 captures an image of the object light passing through the display unit 2. As illustrated in FIG. 1A, the display unit 2 includes a plurality of layers, and there is no problem as long as each layer has a high transmittance of light in a wavelength band in which the imaging unit 4 has sufficient sensitivity, but there is a possibility that transmittance of some layers are low in practice. For example, the visible light transmittance of the polyimide substrate 2c is not so high. Therefore, as illustrated in FIG. 1B, one or more openings 2k may be formed in a layer having not so high transmittance among a plurality of layers constituting the display unit 2, and the camera module 3 may capture an image of the light passing through the opening 2k. In the example of FIG. 1B, a plurality of the openings 2k penetrating a layer other than the cover glass 2j among a plurality of the layers constituting the display unit 2 is provided. These openings 2k are provided at positions overlapping with the camera module 3 in a plan view of the display unit 2. The diameter and the number of each opening 2k are set to appropriate values in consideration of the display of the display unit 2 and the image quality of the image captured by the imaging unit 4.

Note that in a case where a highly transparent substrate is used instead of the polyimide substrate 2c, the opening 2k is not necessarily provided.

Figure 3:
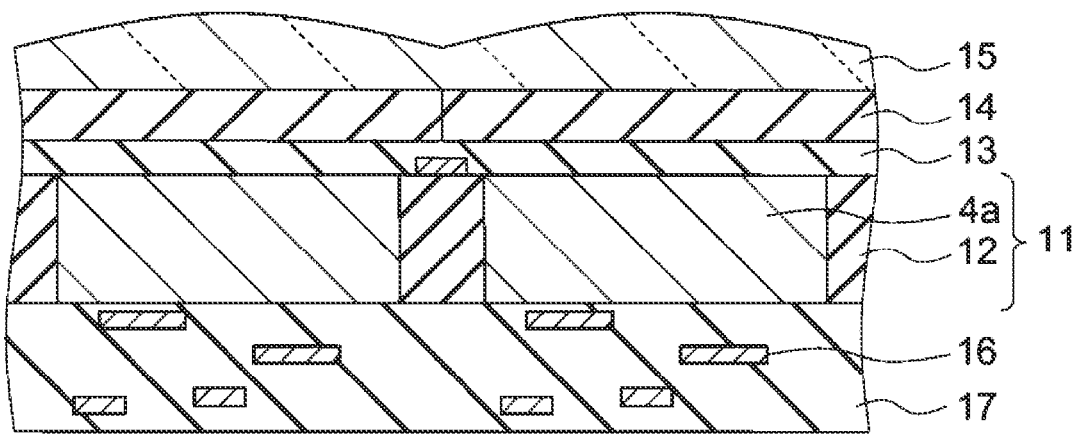
FIG. 3 is a cross-sectional view illustrating an example of a cross-sectional structure of an imaging unit.

FIG. 3 is a cross-sectional view illustrating an example of a cross-sectional structure of the imaging unit 4. The imaging unit 4 of FIG. 3 includes the photoelectric conversion unit 4a formed in a semiconductor substrate 11, and the photoelectric conversion unit 4a is divided by an element separation layer 12 for each pixel. A flattening layer 13 is disposed on the photoelectric conversion unit 4a, and a color filter layer 14 is disposed on the flattening layer 13. The color filter layer 14 may include a filter layer of three colors of RGB, or may include a filter layer of cyan, magenta, and yellow which are complementary colors of RGB. Alternatively, a filter layer that transmits colors other than visible light such as infrared light may be provided, a filter layer having a multispectral characteristic may be provided, or a filter layer of a decreased color such as white may be provided. By transmitting light other than visible light such as infrared light, sensing information such as depth information can be detected. An on-chip lens 15 is disposed on the color filter layer 14. The light enters through the on-chip lens 15. In the present specification, the side on which the on-chip lens 15 is disposed is referred to as a back surface side of the imaging unit 4.

On a front surface side of the imaging unit 4, a readout circuit 16 is formed on the semiconductor substrate 11, and the periphery of the readout circuit 16 is covered by an interlayer insulation film 17. The readout circuit 16 includes a transfer transistor, a reset transistor, an amplification transistor, a selection transistor, and the like. Note that a cross-sectional structure of the imaging unit 4 is not limited to the cross-sectional structure illustrated in FIG. 3.

FIG. 4A is a block diagram illustrating an internal configuration of the electronic apparatus 1 according to the first embodiment. As illustrated in FIG. 4A, the electronic apparatus 1 includes an imaging device 21, an application processor 22, an image signal generation unit 23, an A/D conversion unit 24, a display control unit 25, and the display unit 2.

The imaging device 21 can include one or a plurality of semiconductor devices, and includes an A/D conversion unit 31, a signal processing unit 32, an imaging control unit 33, an exposure adjustment unit 34, an abnormality detection unit 35, and an output unit 36 in addition to the imaging unit 4 included in the camera module 3, the optical system 5, and an infrared ray (IR) cut filter 6.

The A/D conversion unit 31 converts an analog pixel signal captured by the imaging unit 4 into digital pixel data.

Figure 4B:
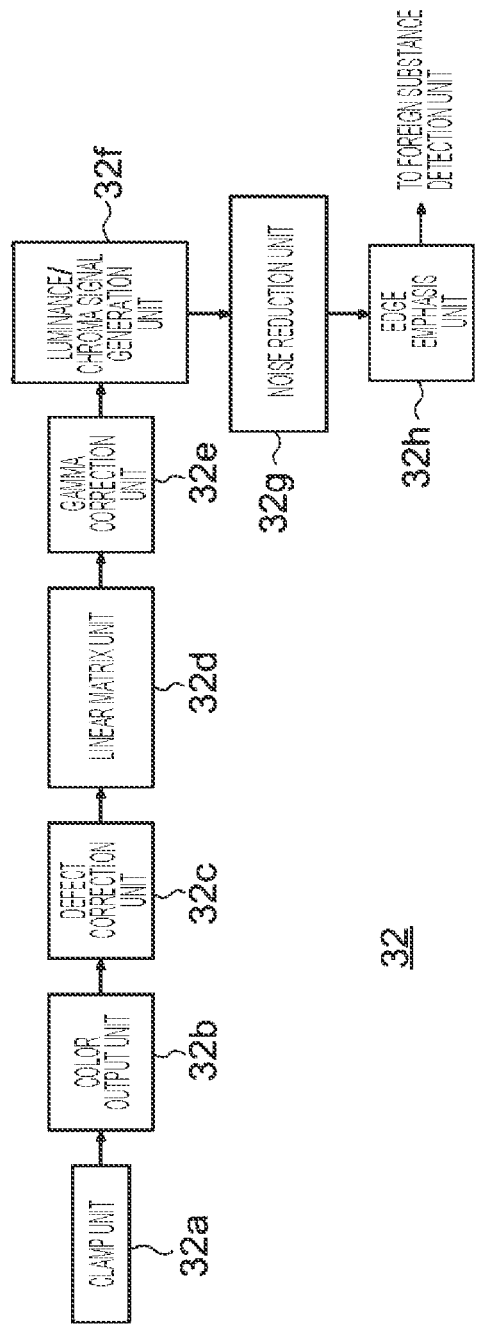
FIG. 4B is a block diagram illustrating an internal configuration of a signal processing unit.

For example, as illustrated in detail in FIG. 4B, the signal processing unit 32 includes a clamp unit 32a, a color output unit 32b, a defect correction unit 32c, a linear matrix unit 32d, a gamma correction unit 32e, a luminance/chroma signal generation unit 32f, a noise reduction unit 32g, and an edge emphasis unit 32h.

The clamp unit 32a performs processing of defining a black level. More specifically, the clamp unit 32a performs processing of subtracting black level data from the digital pixel data. The color output unit 32b outputs, for example, pixel data for each color of RGB. The defect correction unit 32c performs processing of correcting the imaged data of the specific pixel that cannot be correctly read for some reason in accordance with the imaged data of surrounding pixels. The linear matrix unit 32d performs matrix operation on color information for RGB to perform more correct color reproduction. The gamma correction unit 32e performs gamma correction so as to enable display excellent in visibility in accordance with a display characteristic of the display unit 2. For example, the gamma correction unit 32e performs conversion from ten bits to eight bits while changing a gradient. The luminance/chroma signal generation unit 32f generates a luminance/chroma signal for the display unit 2 to display on the basis of output data of the gamma correction unit 32e. The noise reduction unit 32g performs processing of reducing noise included in the luminance/chroma signal. The edge emphasis unit 32h performs processing of emphasizing an edge of an object image on the basis of the luminance/chroma signal. The noise reduction processing of the noise reduction unit 32g and the edge emphasis processing of the edge emphasis unit 32h may be performed only in a case where a predetermined condition is satisfied. The output unit 36 outputs the luminance/chroma signal subjected to the noise reduction processing.

The imaging control unit 33 sets a frame rate at which the imaging unit 4 performs imaging on the basis of the luminance/chroma signal. The exposure adjustment unit 34 adjusts an exposure time according to the frame rate set by the imaging control unit 33. The photoelectric conversion unit 4a performs imaging for each pixel according to the exposure time adjusted by the exposure adjustment unit 34.

The abnormality detection unit 35 detects an abnormality on the display surface of the display unit 2. The abnormality includes various deposits on the display surface, scratches on the display surface, deposits and scratches on a protective material such as a film for protecting the display surface, bubbles between the display surface and the protective material, and the like. The deposits include stains, hand oil, solidified substances, liquefied substances, and the like. The scratches include breaks, cracks, chips, and the like. In this manner, the abnormality detection unit 35 detects a plurality of types of abnormalities. In the present specification, the abnormality may be collectively referred to as a foreign substance.

The abnormality detection unit 35 transmits detected abnormality information to the application processor 22. Here, the abnormality information is, for example, information on the type and position of the abnormality. Furthermore, the abnormality detection unit 35 transmits captured image data including the abnormality information to the output unit 36. The output unit 36 outputs the captured image data together with the abnormality information. The output unit 36 may send, to the image signal generation unit 23, the captured image data showing the abnormality.

The application processor 22 is a semiconductor device separate from the camera module 3, and is mounted on the same substrate as or a different substrate from the camera module 3. The application processor 22 includes a central processing unit (CPU) and the like therein, and executes an operating system or programs such as various application software. The application processor 22 may have a function of performing image processing of a graphics processing unit (GPU), signal processing of a baseband processor, or the like. The application processor 22 executes various processing on the input image data and calculation result as necessary, performs control to display an image on the display unit 2 of the electronic apparatus 1, or transmits the image to an external cloud server via a predetermined network.

When receiving the abnormality information sent from the abnormality detection unit 35, the application processor 22 sends the information to the display control unit 25. The display control unit 25 highlights a position where the abnormality detected by the abnormality detection unit 35 occurs on the display unit 2. A specific example of highlighting will be described later.

The image signal generation unit 23 generates an image signal for displaying the image on the display unit 2. The A/D conversion unit 24 converts the image signal into digital pixel data. The display control unit 25 performs control to display the digital pixel data on the display unit 2. At this time, as described above, the position where the abnormality occurs is highlighted on the basis of the abnormality information detected by the abnormality detection unit 35.

Figure 5:
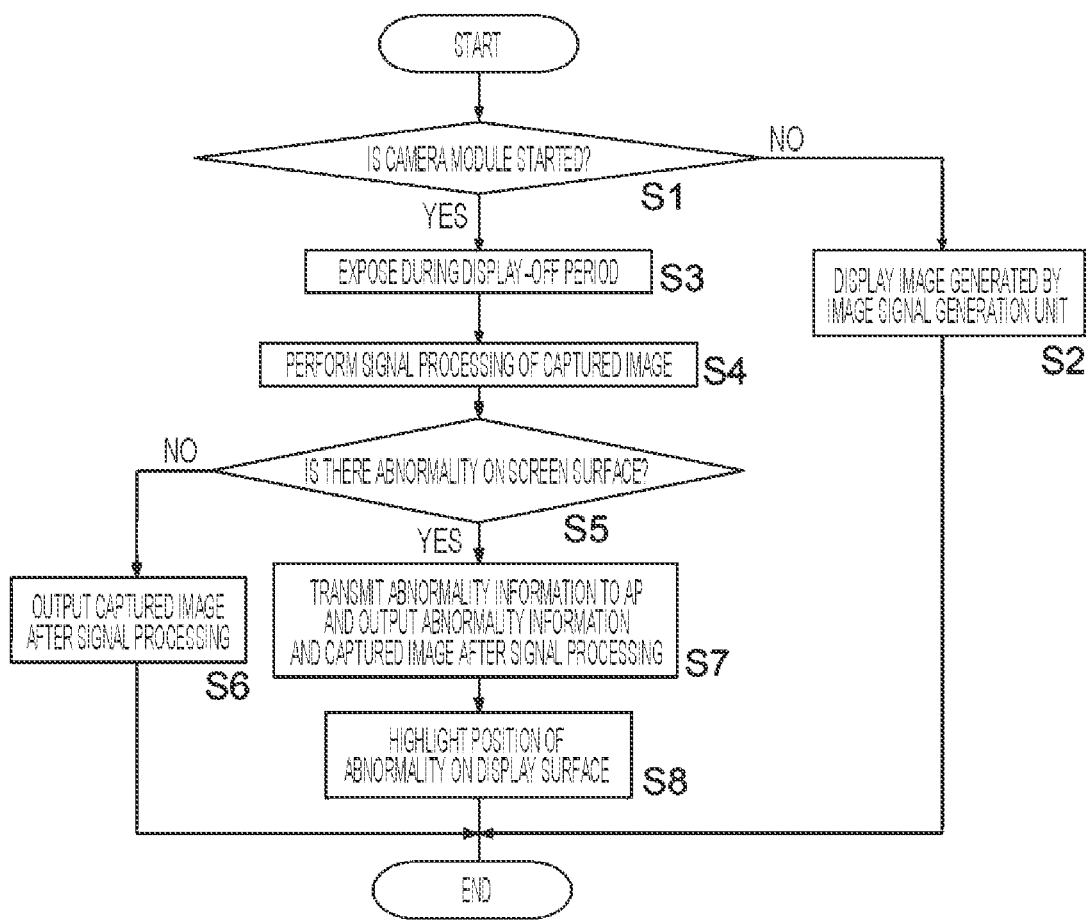
FIG. 5 is a flowchart illustrating processing operation of the electronic apparatus 1 according to the first embodiment.

FIG. 5 is a flowchart illustrating processing operation of the electronic apparatus 1 according to the first embodiment, and illustrates, for example, processing operation of the application processor 22, processing operation of the imaging control unit 33, and processing operation of the display control unit 25. This flowchart is continuously repeated while the electronic apparatus 1 is powered on.

First, it is determined whether or not a user of the electronic apparatus 1 starts the camera module 3 (Step S1). When the user does not start the camera module 3, the image generated by the image signal generation unit 23 is displayed on the display unit 2 on the basis of an instruction from the application processor 22 (Step S2).

In a case where the user starts the camera module 3, exposure is performed by the imaging unit 4 during a display-off period of the display unit 2 (Step S3). The display on the display unit 2 is updated at a frequency of 30 to 120 frames per second. There is a display-off period in which display is not performed between two consecutive frames. Furthermore, in one frame, the display is performed while scanning each horizontal line, and there is the display-off period in which the display is not performed between the horizontal lines. In Step S3, exposure is performed by the imaging unit 4 within these display-off periods.

The reason why the exposure is performed within the display-off period is that there is a possibility that the captured image is adversely affected when the camera module 3 performs imaging in a state in which the image is displayed on the display unit 2. However, as will be described later, there may be a case where imaging is performed in a state in which the display unit 2 is intentionally caused to emit light in a predetermined emission color in order to detect the abnormality. Therefore, more precisely, the display-off period in Step S3 refers to a period in which the image display, which is displayed on the display unit 2 before the camera module 3 is started, is not performed.

Next, the signal processing unit 32 performs various signal processing on the captured image obtained by the exposure processing of the imaging unit 4 (Step S4).

Next, the abnormality detection unit 35 detects whether or not there is an abnormality on the display surface on the basis of the captured image data after the signal processing (Step S5). Various methods are conceivable as an abnormality detection method, and specific examples thereof will be described later. In a case where the abnormality is not detected, the captured image data output from the signal processing unit 32 is sent to the output unit 36 (Step S6).

When the abnormality is detected in Step S5, the abnormality detection unit 35 sends the abnormality information including the position where the abnormality occurs to the application processor 22, and sends the abnormality information and the captured image data to the output unit 36 (Step S7).

The application processor 22 sends the abnormality information sent from the abnormality detection unit 35 to the display control unit 25. When displaying the image based on the image signal generated by the image signal generation unit 23 on the display surface, the display control unit 25 highlights the position where the abnormality occurs on the display surface (Step S8).

Figure 6A:
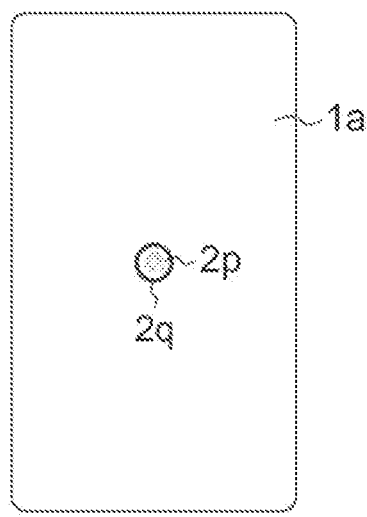
FIG. 6A is a diagram illustrating a specific example of highlighting a position where an abnormality occurs.

FIGS. 6A, 6B, 6C, and 6D are diagrams illustrating a specific example of highlighting a position where an abnormality 2p occurs. FIG. 6A illustrates an example of displaying an annular indicator 2q surrounding the position where the abnormality 2p occurs. The indicator 2q of FIG. 6A is desirably displayed in a display color different from the display color of the background image in a noticeable manner. Furthermore, a line width of the indicator 2q may be increased.

Figure 6B:
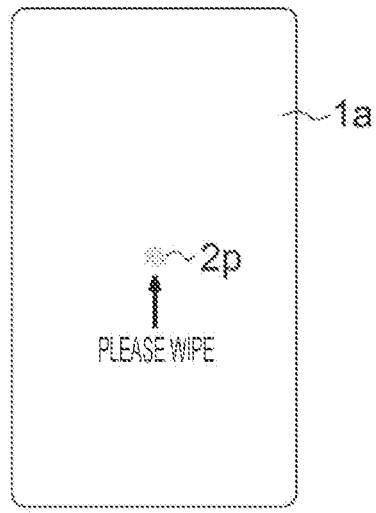
FIG. 6B is a diagram illustrating a specific example of highlighting a position where an abnormality occurs.

FIG. 6B illustrates an example of displaying an arrow indicator 2q indicating the position where the abnormality 2p occurs. Furthermore, a message "Please wipe" may be written as character information at an arrow head of the arrow.

Figure 6C:
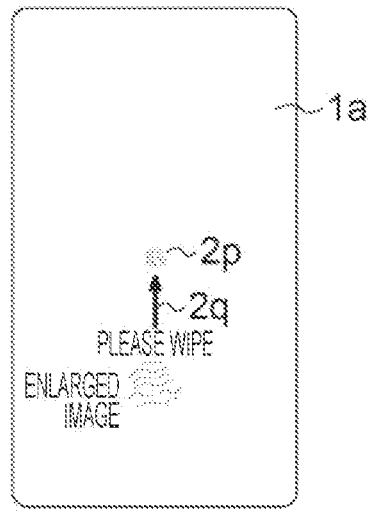
FIG. 6C is a diagram illustrating a specific example of highlighting a position where an abnormality occurs.

FIG. 6C illustrates an example in which the abnormality 2p included in the captured image data is enlarged and displayed on the display surface in order to notify the user of a type of abnormality 2p. FIG. 6C illustrates an example in which the abnormality 2p is a fingerprint, and the user can grasp the type of the abnormality by using the enlarged image.

Figure 6D:
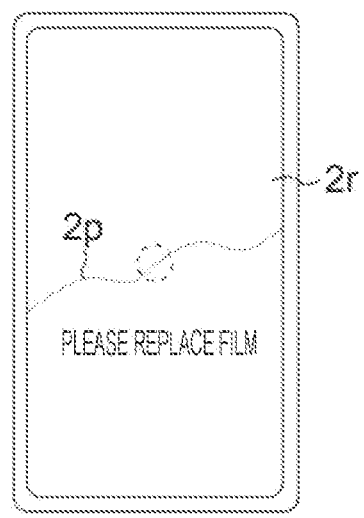
FIG. 6D is a diagram illustrating a specific example of highlighting a position where an abnormality occurs.

FIG. 6D illustrates an example in which the abnormality 2p is damage to a film 2r stuck to the display surface. In this case, a message "Please replace a film" or the like may be written as character information.

As described above, in the first embodiment, when the abnormality 2p on the display surface is detected at the time of imaging by the imaging unit 4 disposed on the opposite side to the display surface of the display unit 2, the position where the abnormality 2p occurs is highlighted on the display unit 2. Therefore, it is possible to notify the user in advance that there is a problem in imaging by the imaging unit 4, and to urge the user to remove the abnormality 2p. An image quality of the captured image can be improved when the user performs the imaging by the imaging unit 4 after performing a work of eliminating the abnormality 2p, such as wiping the display surface, at the time of highlight of the display unit 2.

Second Embodiment

In the second embodiment, the abnormality 2p is detected on the basis of a plurality of captured images captured in a state of emitting light at a plurality of emission wavelengths.

Figure 7A:
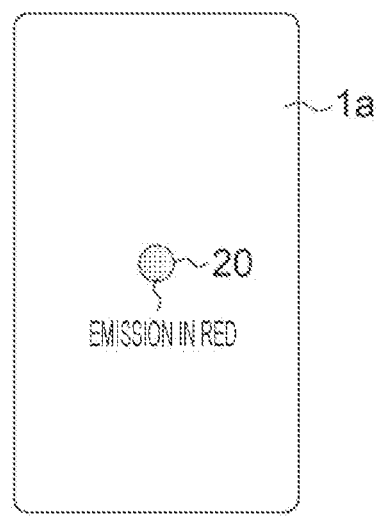
FIG. 7A is a diagram schematically illustrating an example in which exposure is performed by an imaging unit in a state in which a display region, which is a part of a display surface, is caused to emit light at different emission wavelengths.
Figure 7B:
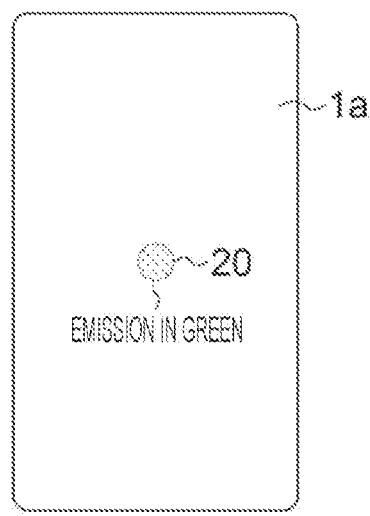
FIG. 7B is a diagram schematically illustrating an example in which exposure is performed by an imaging unit in a state in which a display region, which is a part of a display surface, is caused to emit light at different emission wavelengths.
Figure 7C:
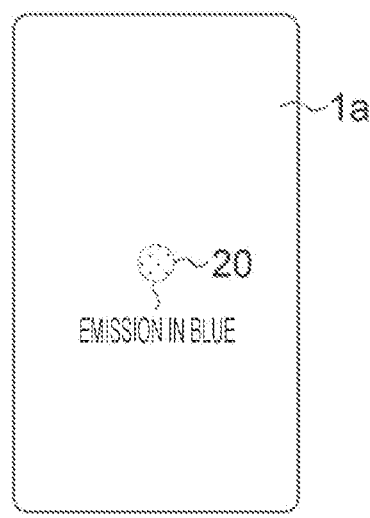
FIG. 7C is a diagram schematically illustrating an example in which exposure is performed by an imaging unit in a state in which a display region, which is a part of a display surface, is caused to emit light at different emission wavelengths.

FIGS. 7A, 7B, and 7C are diagrams schematically illustrating an example in which exposure is performed by the imaging unit 4 in a state in which a display region 20, which is a part of the display surface 1a and in an angle-of-view range of the camera module 3, is caused to emit light at different emission wavelengths. For example, FIGS. 7A to 7C illustrate examples in which light is emitted at emission wavelengths of red, green, and blue to perform exposure, respectively.

As described above, the imaging by the camera module 3 is performed in the display-off period such as between frames or between the horizontal lines, but the light emissions in FIGS. 7A to 7C are for detecting the foreign substances and is performed using a part of the display period.

The electronic apparatus 1 according to the second embodiment has an internal configuration similar to that in FIGS. 4A and 4B, but performs processing operation partially different from that in FIG. 5.

Figure 8:
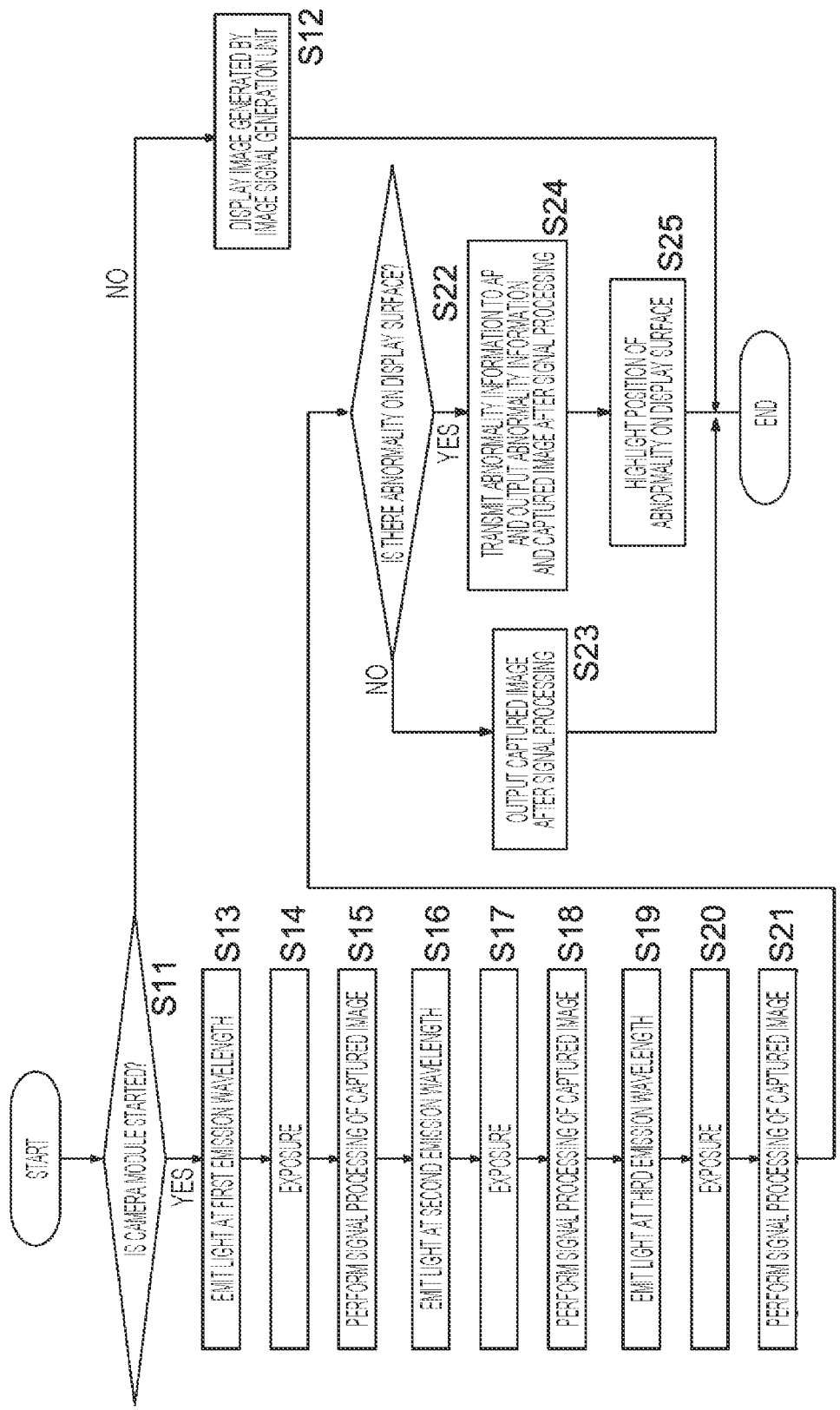
FIG. 8 is a flowchart illustrating processing operation of an electronic apparatus according to a second embodiment.

FIG. 8 is a flowchart illustrating processing operation of the electronic apparatus 1 according to the second embodiment. Hereinafter, the processing operation different from that in FIG. 5 will be mainly described. In a case where the user does not start the camera module 3, the same operation as in Steps S1 and S2 of FIG. 5 is performed (Steps S11 and S12).

In a case where the user starts the camera module 3, as illustrated in FIG. 7A, the partial display region 20, which is within the angle-of-view range of the camera module 3, is caused to emit light at a first emission wavelength (Step 313). Since an angle-of-view range varies depending on the focal length of the lens included in the camera module 3, the size of the display region 20 caused to emit the light at the first emission wavelength also needs to be adjusted according to the focal length of the lens. Alternatively, the entire region of the display surface 1a may emit the light at the first emission wavelength.

While the light is emitted in Step S13, the imaging unit 4 performs exposure (Step S14), and the signal processing unit 32 performs various signal processing to generate captured image data (Step S15).

Next, the same operation as in Steps S13 to S15 is performed in a state in which the display region 20 is caused to emit light at a second emission wavelength as illustrated in FIG. 7B (Steps S16 to S18). Subsequently, the same operation as in Steps S13 to S15 is performed in a state in which the display region 20 is caused to emit light at a third emission wavelength as illustrated in FIG. 7C (Steps S19 to S21).

The abnormality detection unit 35 detects the presence or absence of the abnormality 2p on the basis of the three pieces of captured image data obtained in Steps S15, S18, and S21 (Steps S22 to S24).

As described above, in the second embodiment, the imaging unit 4 performs the imaging in a state in which the display region 20, which is at least a part of the display unit 2, is caused to emit light at a plurality of types of emission wavelengths, and the abnormality detection unit 35 detects the abnormality 2p on the basis of a plurality of pieces of the captured image data obtained. According to the type of abnormality 2p, only light of a specific emission wavelength is reflected or transmitted. Therefore, by performing the imaging in a state in which the display unit 2 emits light at a plurality of types of emission wavelengths, the presence or absence of the abnormality 2p and the type of abnormality 2p can be easily specified.

Third Embodiment

In the third embodiment, when the abnormality detection unit 35 detects the abnormality 2p, the correction processing for the captured image data is performed.

Figure 9:
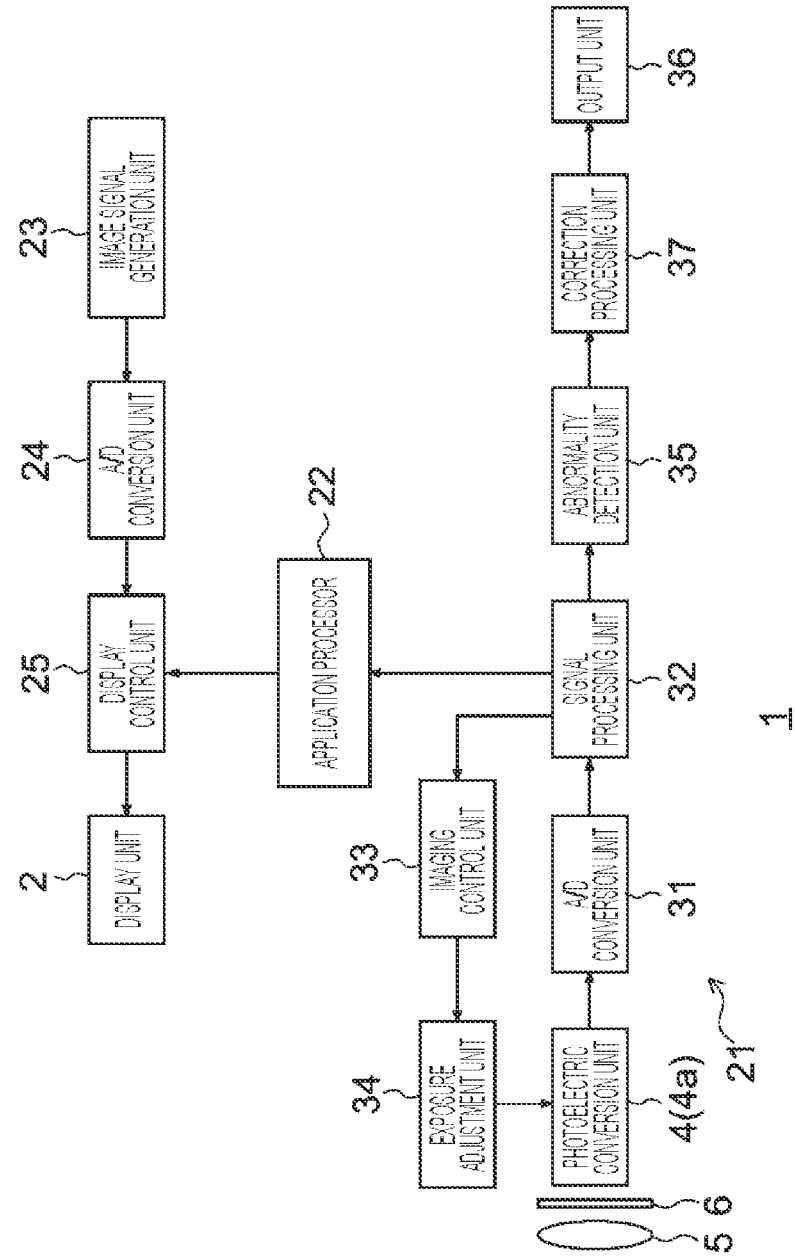
FIG. 9 is a block diagram illustrating an internal configuration of an electronic apparatus according to a third embodiment.

FIG. 9 is a block diagram illustrating an internal configuration of the electronic apparatus 1 according to the third embodiment. The electronic apparatus 1 of FIG. 9 is obtained by adding a correction processing unit 37 to the electronic apparatus 1 of FIG. 4A. The correction processing unit 37 corrects the image displayed on the display unit 2 so that the abnormality 2p is not noticeable. More specifically, the correction processing unit 37 performs correction processing on the captured image data output from the signal processing unit 32 on the basis of information regarding the abnormality 2p detected by the abnormality detection unit 35, and outputs the image data after the correction processing. The image data output from the correction processing unit 37 is sent to the output unit 36. The correction processing performed by the correction processing unit 37 may include, for example, at least one of edge emphasis processing, distortion correction processing, and scratch correction processing.

The abnormality detection unit 35 in the electronic apparatus 1 according to the third embodiment may cause the display surface 1a to emit light at a plurality of emission wavelengths to detect the abnormality 2p of the display surface 1a as in the second embodiment. The abnormality detection unit 35 according to the present embodiment can detect the type of abnormality 2p, and an absorption characteristic and a scattering characteristic for a specific emission wavelength change in accordance with the type of abnormality 2p. The abnormality detection unit 35 can relatively accurately estimate the type of abnormality 2p from a correspondence relationship between the emission wavelength and the absorption characteristic or scattering characteristic. When the abnormality detection unit 35 can detect the type of abnormality 2p, the correction processing unit 37 can perform appropriate correction processing according to the type of abnormality 2p.

Figure 10:
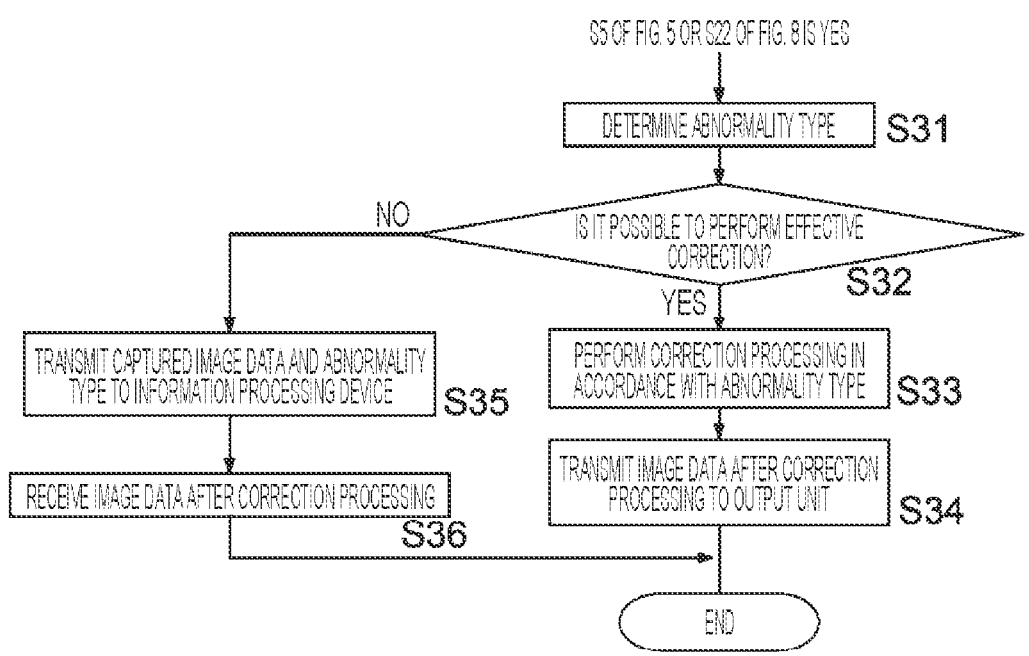
FIG. 10 is a flowchart illustrating a processing procedure of correction processing performed by a correction processing unit.

FIG. 10 is a flowchart illustrating a processing procedure of the correction processing performed by the correction processing unit 37. The correction processing of FIG. 10 is performed instead of Steps S7 and S8 of FIG. 5 or Steps S24 and S25 of FIG. 8 in a case where it is determined that there is an abnormality on the display surface 1a in Step S5 of FIG. 5 or Step S22 of FIG. 8.

First, the type of abnormality 2p is determined on the basis of the information regarding the abnormality 2p detected by the abnormality detection unit 35 (Step S31).

Next, it is determined whether or not the correction processing unit 37 of the electronic apparatus 1 can perform effective correction processing (Step S32). For example, in a case where the electronic apparatus 1 is a portable apparatus such as a smartphone, hardware performance is inferior to that of a PC, a server, or the like, and it is difficult to perform advanced correction processing. Therefore, in a case where the correction processing satisfying the user cannot be performed within several seconds, it is determined that the effective correction processing cannot be performed. The determination processing in Step S32 is performed by the correction processing unit 37, for example.

When it is determined that the effective correction processing can be performed in Step S32, the correction processing unit 37 performs the correction processing according to the type of abnormality 2p (Step S33). For example, when the abnormality detection unit 35 detects that the abnormality 2p is hand oil adhering on the display surface 1a, the edge of the captured image captured via the hand oil tends to be blurred. Therefore, the edge emphasis processing is performed. In this case, the edge emphasis processing may be performed inside the correction processing unit 37, or the correction processing unit 37 may instruct the edge emphasis unit 32h of the signal processing unit 32 to enhance the edge emphasis processing. Furthermore, when the abnormality detection unit 35 detects that the abnormality 2p is a water droplet adhering to the display surface 1a, the object light is refracted by the water droplet, and thus distorted captured image data is obtained. Therefore, the correction processing unit 37 may perform distortion correction processing, and when the abnormality detection unit 35 detects that the abnormality 2p is a scratch on the display surface 1a, the correction processing unit 37 may perform correction processing of removing the scratch. The image data after the correction processing is sent to the output unit 36 (Step S34).

On the other hand, when it is determined that the effective correction processing cannot be performed in Step S32, the captured image data output from the signal processing unit 32 and the information regarding the abnormality 2p detected by the abnormality detection unit 35 are transmitted to a specific information processing apparatus that performs advanced correction processing (Step S35). The information processing apparatus may be, for example, a server apparatus connected to a network or a high-performance PC. Thereafter, in the information processing apparatus, the correction processing is performed on the captured image data and the correction processing unit 37 receives the image data after the correction processing (Step S36). The received image data after the correction processing is sent to the output unit 36.

Figure 11:
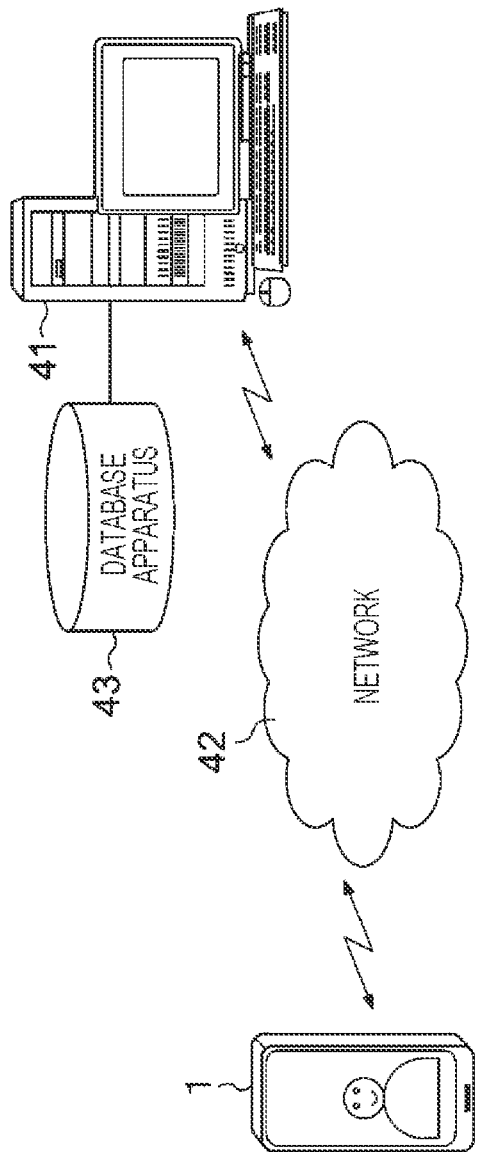
FIG. 11 is a block diagram illustrating an example of a connection form between an electronic apparatus and an information processing apparatus.

FIG. 11 is a block diagram illustrating an example of a connection form between the electronic apparatus 1 and an information processing apparatus 41. In the example of FIG. 11, the electronic apparatus 1 and the information processing apparatus 41 transmit and receive information via a network 42. The information processing apparatus 41 may be provided in an unspecified place separated from the electronic apparatus 1, that is, in a cloud environment, or may be provided in a place (for example, a base station or the like) relatively close to the electronic apparatus 1 in a similar manner to a mobile edge computing (MEC).

A database apparatus 43 is connected to the information processing apparatus 41, and the database apparatus 43 stores information regarding a correspondence relationship between the type of abnormality 2p and the correction processing and information regarding a model that performs the correction processing according to the type of abnormality 2p. The information processing apparatus 41 learns a model by using the type of abnormality 2p and the captured image data as input data for the model such that the captured image data subjected to appropriate correction processing is output. In the process of learning, weight information of a neural network is variously changed to update the model. The information processing apparatus 41 accumulates various types of abnormality 2p and a result of the correction processing in the database apparatus 43, repeats learning of the model, and thus a highly reliable model can be generated. By learning such a model in advance, it is possible to perform highly reliable correction processing in a short time on the type of abnormality 2p and the captured image data, which are sent from the electronic apparatus 1 and return the image data after the correction processing to the electronic apparatus 1.

Note that, in the flowchart of FIG. 10, an example has been described in which the correction processing is performed by the external information processing apparatus 41 in a case where it is determined that the effective correction processing cannot be performed inside the electronic apparatus 1. However, in a case where the external information processing apparatus 41 does not exist or in a case where communication with the external information processing apparatus 41 cannot be performed for some reason, the fact that the effective correction processing cannot be performed may be displayed on the display unit 2.

As described above, in the third embodiment, when the abnormality 2p is detected by the abnormality detection unit 35, the correction processing for the captured image data is performed such that the abnormality 2p is not noticeable. Therefore, high-quality captured image data can be obtained without the user performing the work of removing the abnormality 2p on the display surface 1a.

Fourth Embodiment

In the fourth embodiment, a plurality of the camera modules 3 is disposed on the opposite side to the display surface 1a of the display unit 2.

Figure 12:
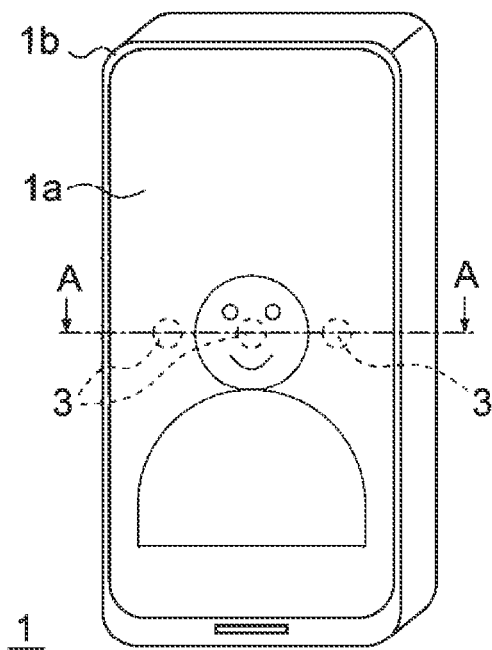
FIG. 12 is a plan view of an electronic apparatus according to a fourth embodiment.

FIG. 12 is a plan view of the electronic apparatus 1 according to the fourth embodiment. In the electronic apparatus 1 of FIG. 12, three camera modules 3 are disposed on the opposite side to the display surface 1a of the display unit 2. Note that the number of camera modules 3 is not limited to three. A focal length of each camera module 3 may be the same or different.

Figure 13:
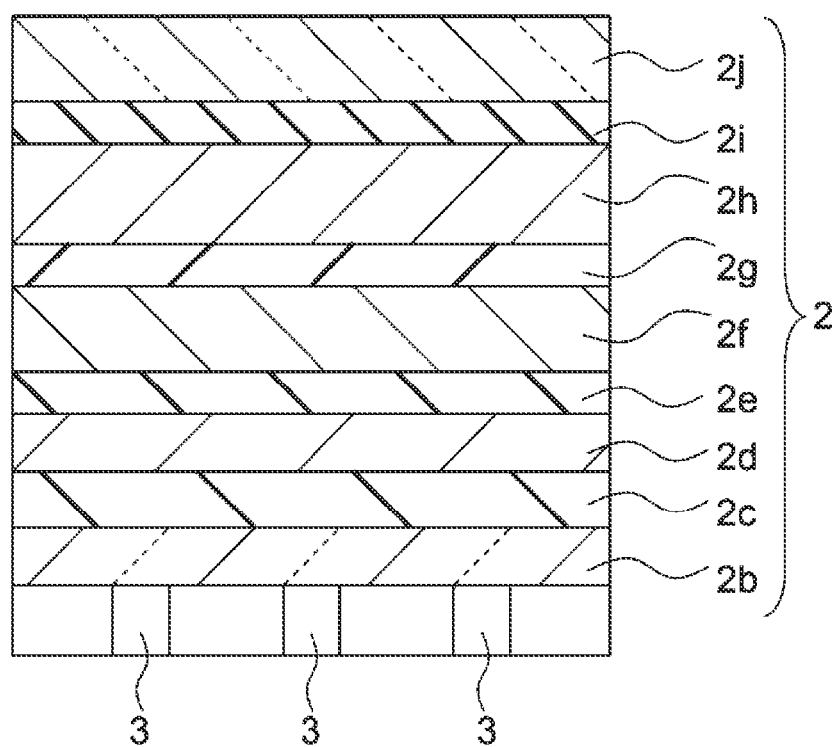
FIG. 13 is a cross-sectional view taken along line A-A of FIG. 12.

FIG. 13 is a cross-sectional view taken along line A-A of FIG. 12. The imaging range of each camera module 3 is indicated by a broken line. In the present embodiment, at least two camera modules 3 can image an arbitrary place on the display surface 1a of the display unit 2. Therefore, the abnormality 2p occurring at an arbitrary place on the display surface 1a can be imaged by a plurality of the camera modules 3.

The type of abnormality 2p can be easily specified by imaging an abnormal place on the display surface 1a in different directions. The abnormality detection unit 35 detects the type of abnormality 2p with reference to a plurality of pieces of captured image data captured by a plurality of the camera modules 3. At that time, similarly to the second embodiment, the imaging may be performed in a state in which the display surface 1a is caused to emit light at a plurality of different emission wavelengths.

The correction processing unit 37 performs correction processing for removing the abnormality 2p on the basis of a plurality of pieces of captured image data captured by a plurality of the camera modules 3. It is possible to perform effective correction processing when performing the correction processing on the basis of a plurality of captured image data captured in a plurality of directions as compared with when performing the correction processing on the basis of captured image data captured in one direction. Note that, in a case where the correction processing unit 37 determines that the effective correction processing cannot be performed, a plurality of pieces of the captured image data captured by a plurality of the camera modules 3 may be transmitted to the external information processing apparatus 41, and the information processing apparatus 41 may perform the correction processing.

As described above, in the fourth embodiment, by providing a plurality of the camera modules 3, the abnormality 2p in an arbitrary place on the display surface 1a can be imaged by at least two camera modules 3. Therefore, it is possible to more accurately detect the presence or absence of the abnormality 2p and the type of the abnormality 2p, and perform the correction processing for removing the abnormality 2p.

Fifth Embodiment

The fifth embodiment relates to a specific detection method of the abnormality 2p, and can be applied to the abnormality detection unit 35 according to the first to fourth embodiments.

Figure 14:
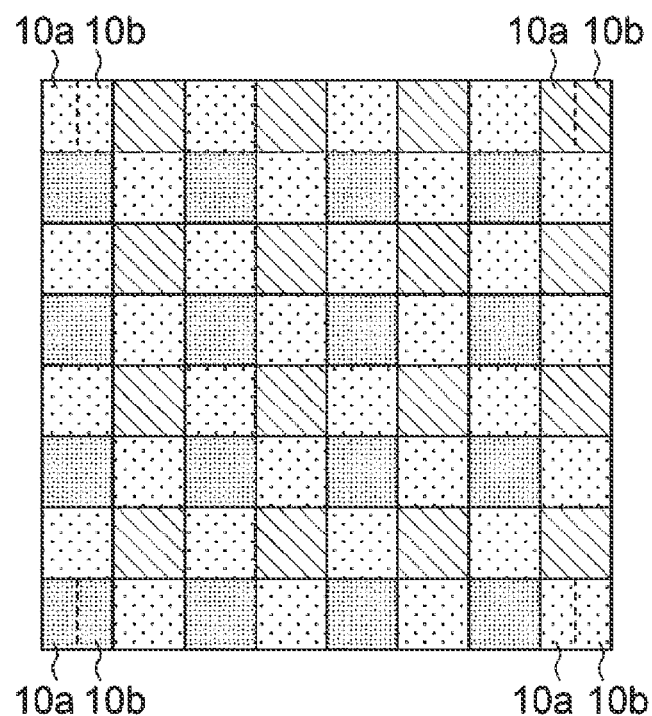
FIG. 14 is a plan view illustrating an example of a pixel arrangement of an imaging unit according to a fifth embodiment.

FIG. 14 is a plan view illustrating an example of a pixel arrangement of the imaging unit 4 according to the fifth embodiment. In the example of FIG. 14, pixels for three colors of RGB are disposed in a two-dimensional direction. Each of the pixels includes a photoelectric conversion unit 4a, and converts incident light into an electric signal corresponding to a light amount. Some of a plurality of the pixels are pixels for phase difference detection, and a pixel region is divided into two. Each of the divided pixels 10a and 10b in the pixel for the phase difference detection individually performs photoelectric conversion. A difference between the electrical signals photoelectrically converted by two divided pixels 10a and 10b is phase difference information, and a defocus amount can be detected on the basis of the phase difference information. The defocus amount can be used to adjust focus. In the example of FIG. 14, the example is described in which the pixels for phase difference detection are disposed at four corners, but where and how many the pixels for phase difference detection are disposed are arbitrary.

The presence or absence of the abnormality 2p can be detected by using the defocus amount obtained by the two divided pixels 10a and 10b constituting the pixel for the phase difference detection. That is, in a case where there is a foreign substance on the display surface 1a, the pixel for the phase difference detection recognizes the foreign substance as a part of the object and detects the defocus amount. The foreign substance can be detected by using the detected defocus amount. For example, in a case where a plurality of the camera modules 3 is disposed as illustrated in FIG. 12, at least two camera modules 3 detect the defocus amount caused by the foreign substance, and thus it is possible to specify that the detected defocus amount is not caused by an originally intended object but caused by the foreign substance on the display surface 1a.

As described above, in the fifth embodiment, by providing the pixels for phase difference detection in a part of the pixel arrangement for imaging, it is possible to accurately detect the abnormality 2p on the display surface 1a.

Sixth Embodiment

The sixth embodiment detects the abnormality 2p on the display surface 1a by a method different from that of the fifth embodiment. Processing of detecting the abnormality 2p according to the sixth embodiment can be applied to the abnormality detection unit 35 according to the first to fourth embodiments.

Figure 15:
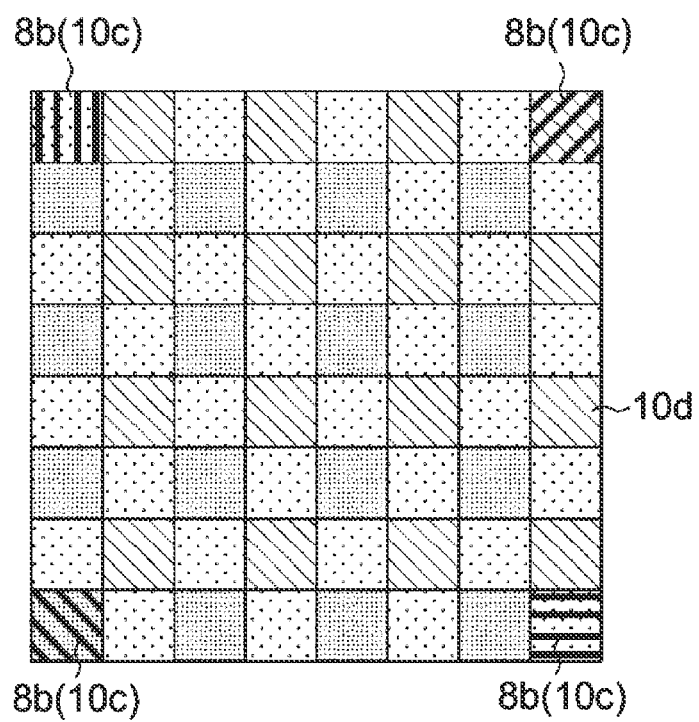
FIG. 15 is a plan view illustrating an example of a pixel arrangement of an imaging unit according to a sixth embodiment.

FIG. 15 is a plan view illustrating an example of a pixel arrangement of the imaging unit 4 according to the sixth embodiment. In the example of FIG. 15, similarly to FIG. 14, pixels for three colors of RGB are disposed in a two-dimensional direction. Each of the pixels includes a photoelectric conversion unit 4a. In some pixels, a polarization element 8b is disposed on a light incident surface side of the photoelectric conversion unit 4a. Hereinafter, the pixel in which the polarization element 8b is disposed is referred to as a polarization pixel 10c, and the pixel in which the polarization element 8b is disposed is referred to as a non-polarization pixel 10d.

The polarization element 8b polarizes light that is incident through the display unit 2. The light polarized by the polarization element 8b is incident on the corresponding photoelectric conversion unit 4a and is photoelectrically converted.

FIG. 15 illustrates an example in which 60 pixels are the non-polarization pixels 10d and four pixels are the polarization pixels 10c among 8×8=64 pixels, but a ratio between the non-polarization pixel 10d and the polarization pixel 10c and a location of the polarization pixel 10c are arbitrary.

Figure 16:
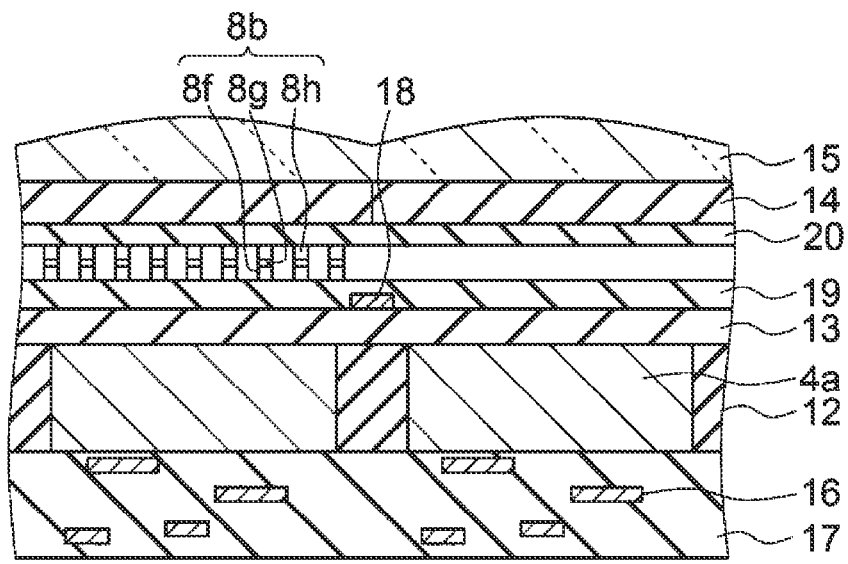
FIG. 16 is a cross-sectional view of the imaging unit according to the sixth embodiment.

FIG. 16 is a cross-sectional view of the imaging unit 4 according to the sixth embodiment. In FIG. 16, the same components as those in FIG. 3 are denoted by the same reference numerals, and differences will be mainly described below. In the imaging unit 4 of FIG. 16, a light shielding layer 18 and an underlying insulation layer 19 are disposed on the flattening layer 13, and a plurality of the polarization elements 8b is disposed on the underlying insulation layer 19 in a state of being separated from each other. The polarization element 8b is, for example, a wire grid polarization element 8b having a line-and-space structure disposed on a part of the underlying insulation layer 19.

Figure 17:
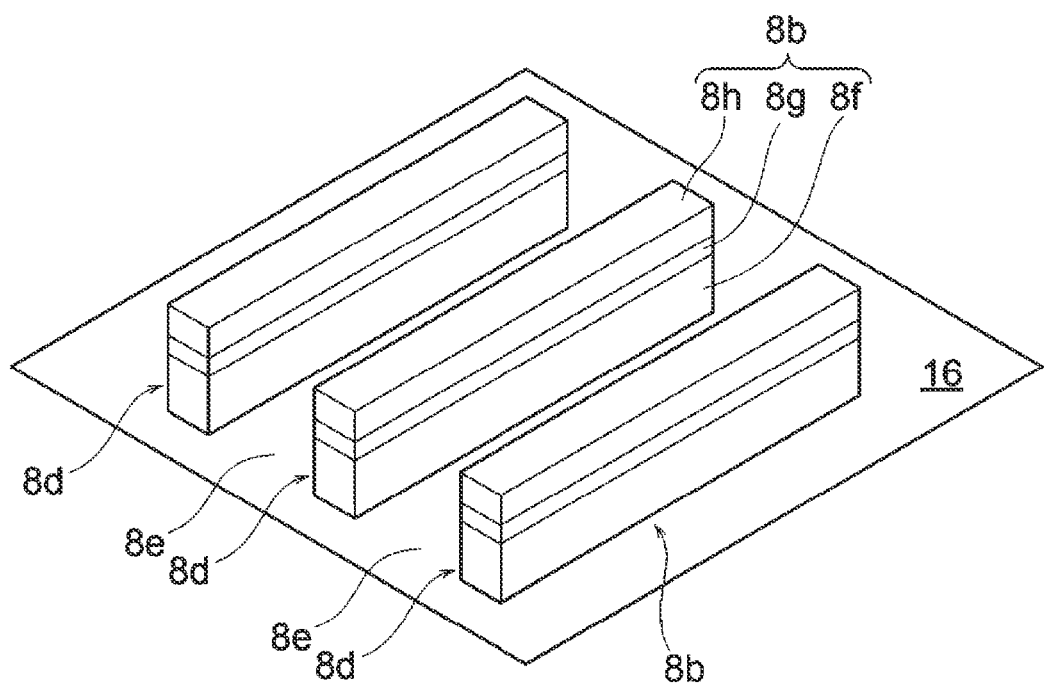
FIG. 17 is a perspective view illustrating an example of a detailed structure of a polarization element.

FIG. 17 is a perspective view illustrating an example of a detailed structure of each polarization element 8b. As illustrated in FIG. 17, each of a plurality of the polarization elements 8b includes a plurality of line portions 8d having a protruding shape extending in one direction and a space portion Se between the line portions 8d. There is a plurality of types of polarization elements 8b in which extending directions of the line portions 8d are different from each other. More specifically, there are three or more types of polarization elements 8b, and for example, three types of angles formed by the arrangement direction of the photoelectric conversion unit 4a and the extending direction of each of the line portions 8d may be zero degrees, 60 degrees, and 120 degrees. Alternatively, the angle between the arrangement direction of the photoelectric conversion unit 4a and the extending direction of the line portion 8d may be four types of angles of zero degrees, 45 degrees, 90 degrees, and 135 degrees, or may be other angles. Alternatively, a plurality of the polarization elements 8b may polarize light only in a single direction. A material of a plurality of the polarization elements 8b may be a metal material such as aluminum or tungsten, or an organic photoelectric conversion film.

As illustrated in FIG. 15, in a case where the imaging unit 4 includes four types of polarization elements 8b, each of the polarization elements 8b passes light each having a different polarization state, and the corresponding photoelectric conversion unit 4a performs the photoelectric conversion. In a case where there is the abnormality 2p on the display surface 1a, the types of light passing through four types of polarization elements 8b change in accordance with the type of abnormality 2p. Therefore, the type of abnormality 2p can be specified by analyzing electric signals photoelectrically converted by four types of polarization pixels 10c.

Furthermore, the polarization pixel 10c can also be used for extracting and removing components of flare and diffraction light which are incident on the display surface 1a.

Figure 18:
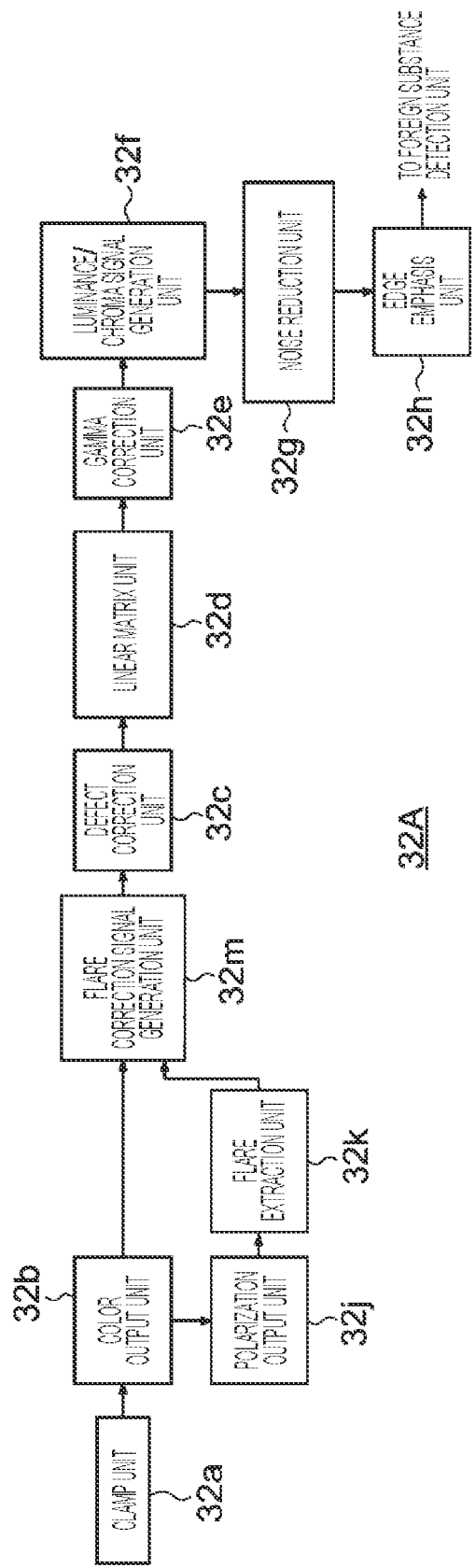
FIG. 18 is a block diagram illustrating an internal configuration of a signal processing unit in an electronic apparatus having a function of suppressing an influence of flare light and diffraction light.

FIG. 18 is a block diagram illustrating an internal configuration of a signal processing unit 32A of the electronic apparatus 1 having a function of suppressing an influence of the flare light and the diffraction light. A configuration other than the signal processing unit 32A of the electronic apparatus 1 is similar to that in FIG. 4A.

In FIG. 18, the same components as those in FIG. 4B are denoted by the same reference numerals, and differences will be mainly described below. The signal processing unit 32A of FIG. 18 includes a polarization output unit 32j, a flare extraction unit 32k, and a flare correction signal generation unit 32m in addition to the internal configuration of the signal processing unit 32 of FIG. 4B.

The polarization output unit 32j outputs polarization information data. The flare extraction unit 32k extracts at least one of the flare component or the diffraction light component from the polarization information data. At least one of the flare component and the diffraction light component extracted by the flare extraction unit 32k is a correction amount. The flare correction signal generation unit 32m corrects digital pixel data by subtracting the correction amount extracted by the flare extraction unit 32k from the digital pixel data output from the color output unit 32b. The output data of the flare correction signal generation unit 32m is digital pixel data from which at least one of the flare component or the diffraction light component is removed. As described above, the flare correction signal generation unit 32m functions as a correction unit that corrects the captured image photoelectrically converted by a plurality of the non-polarization pixels 10d on the basis of the polarization information.

A signal level of the digital pixel data at the pixel position of the polarization pixel 10c is lower by an amount of light passing through the polarization element 8b. Therefore, the defect correction unit 32c regards the polarization pixel 10c as a defect and performs predetermined defect correction processing.

As illustrated in FIGS. 15 to 18, by acquiring the polarization information with a plurality of the polarization element 8b, it is possible to generate captured image in a state in which the flare component and diffraction light component included in the light, which is repeatedly reflected in the display unit 2 and incident on a plurality of the non-polarization pixels 10d, are simply and reliably removed.

As described above, in the sixth embodiment, since the polarization pixel 10c using the polarization element 8b is provided in a part of the pixel arrangement for imaging, the abnormality 2p on the display surface 1a can be detected using the polarization pixel 10c. Furthermore, in the polarization pixel 10c, the flare and diffraction light incident on the display surface 1a can be extracted and removed.

Seventh Embodiment

In the seventh embodiment, the abnormality 2p on the display surface 1a is detected using a sensor that optically detects a distance to the object.

Figure 19:
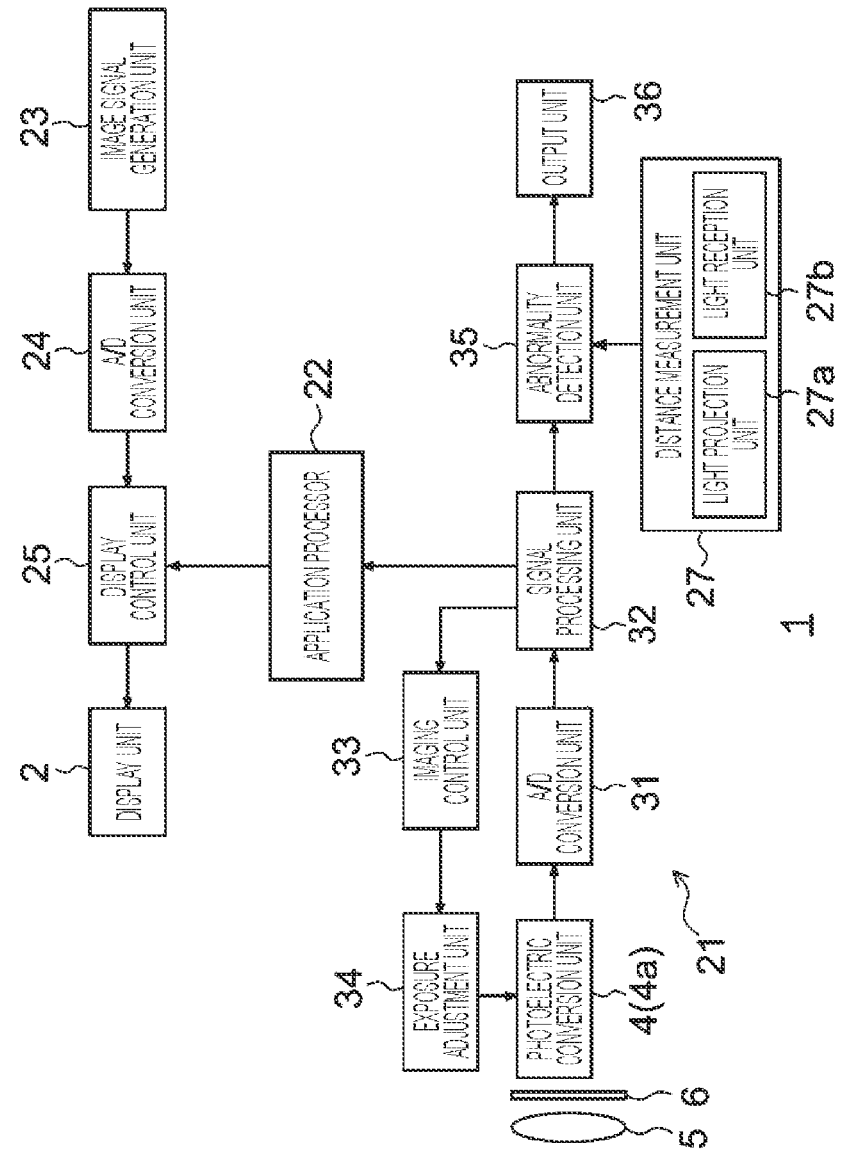
FIG. 19 is a block diagram illustrating a schematic configuration of an electronic apparatus according to a seventh embodiment.

FIG. 19 is a block diagram illustrating a schematic configuration of the electronic apparatus 1 according to the seventh embodiment. The electronic apparatus 1 of FIG. 19 includes a distance measurement unit 27 in addition to the block configuration of the electronic apparatus 1 of FIG. 4A. The distance measurement unit 27 includes a light projection unit 27a and a light reception unit 27b. The light projection unit 27a intermittently emits pulsed light having a predetermined wavelength, and the light reception unit 27b receives the light emitted by the light projection unit 27a and reflected by the object. The distance measurement unit 27 measures a distance to the object on the basis of a difference between a time when light is emitted by the light projection unit 27a and a time when the light is received by the light reception unit 27b. The light projection unit 27a may perform scanning in the light projecting direction within a predetermined angle range. Therefore, the light from the light projection unit 27a can be emitted to the entire region of the display surface 1a.

In a case where there is the abnormality 2p on the display surface 1a of the display unit 2, when the abnormality 2p is a foreign substance, the light from the light projection unit 27a is reflected. Therefore, since a distance from the distance measurement unit 27 to the display surface 1a is known in advance, the abnormality detection unit 35 can accurately detect whether or not the object is a foreign substance on the display surface 1a by using the distance measured by the distance measurement unit 27.

As described above, in the seventh embodiment, since the distance measurement unit 27 that optically detects the distance to the object is provided, it is possible to simply and accurately detect whether or not there is the abnormality 2p on the display surface 1a.

Note that, instead of measuring the distance to the object, by using the time until the light reception unit 27b receives the light after the light projection unit 27a projects light, a plurality of cameras that captures images at different angles of view may be provided, and the distance to the object may be measured on the basis of the captured images captured by a plurality of the cameras.

Eighth Embodiment

In the first to seventh embodiments described above, an example has been described in which the imaging unit 4 of the electronic apparatus 1 is used to image the object, but the imaging unit 4 can be used for biometric authentication applications such as fingerprint detection, iris detection, retina detection, vein detection, and biometric detection. Since an appropriate focal length varies depending on the detection target of the living body, the electronic apparatus 1 of the first to seventh embodiments can be applied to detection of various pieces of biological information by providing a lens having a focal length matching the detection target and optimizing a prism, a light source, and the like.

Ninth Embodiment

In the electronic apparatus 1 according to the ninth embodiment, the optical system 5 of the camera module 3 is different from that of the first to eighth embodiments.

Figure 20:
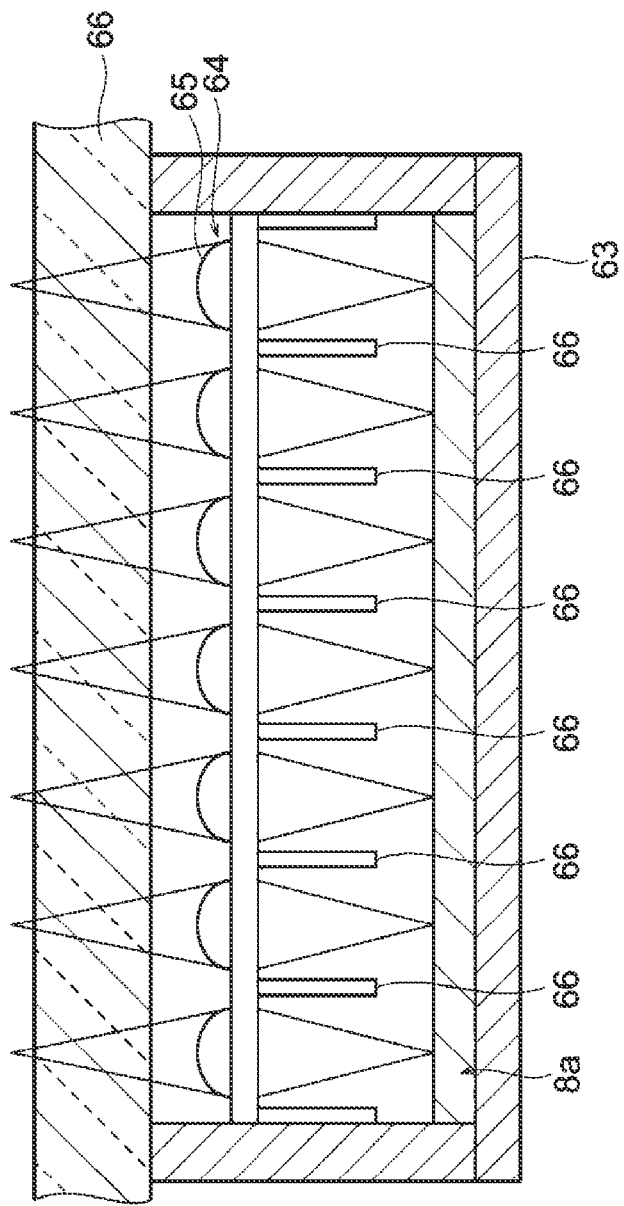
FIG. 20 is a diagram illustrating a cross-sectional structure of an imaging unit of a camera module mounted on an electronic apparatus according to a ninth embodiment.

FIG. 20 is a diagram illustrating a cross-sectional structure of the imaging unit 4 of the camera module 3 mounted on an electronic apparatus 1 according to the ninth embodiment. The imaging unit 4 of FIG. 20 includes a microlens array 64 instead of a single lens or a lens group in which single lenses are arranged in an optical axis direction.

More specifically, the imaging unit 4 of FIG. 20 includes a photoelectric conversion unit 4a disposed along a bottom surface of a housing 63, the microlens array 64 disposed above the photoelectric conversion unit 4a, a plurality of light shielding bodies 66 disposed between adjacent microlenses 65, and a light guide plate 67 disposed above the microlens array 64. The imaging unit 4 of FIG. 20 is applicable to any of the first to eighth embodiments described above.

Tenth Embodiment

Various electronic apparatuses can be considered as specific candidates of the electronic apparatus 1 having the configuration described in the first to ninth embodiments.

Figure 21:
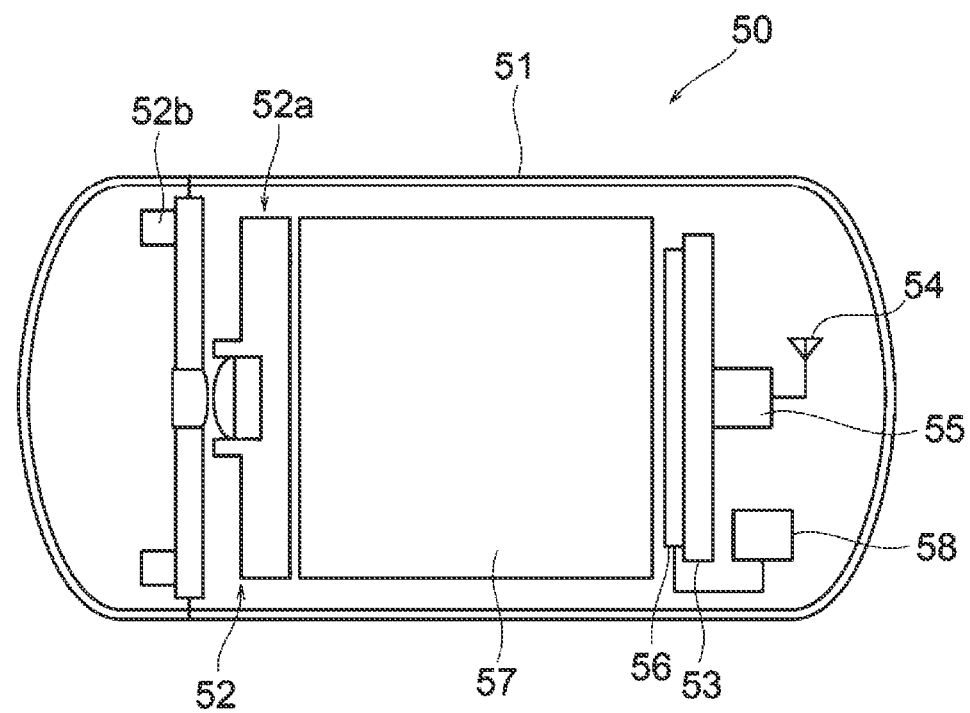
FIG. 21 is a plan view in a case where the electronic apparatus according to the first to ninth embodiments is applied to a capsule endoscope.

For example, FIG. 21 is a plan view in a case where the electronic apparatus 1 according to the first to ninth embodiments is applied to a capsule endoscope 50. The capsule endoscope 50 of FIG. 21 includes, for example, a camera (ultra-small camera) 52 for capturing an image in a body cavity, a memory 53 for recording image data captured by the camera 52, and a wireless transmitter 55 for transmitting the recorded image data to the outside via an antenna 54 after the capsule endoscope 50 is discharged to the outside of a subject, in a housing 51 having both end surfaces hemispherical and a cylindrical central portion.

Furthermore, in the housing 51, a central processing unit (CPU) 56 and a coil (magnetic force/current conversion coil) 57 are provided. The CPU 56 controls imaging by the camera 52 and data accumulation operation in the memory 53, and controls data transmission of the wireless transmitter 55 from the memory 53 to a data reception device (not illustrated) outside the housing 51. The coil 57 supplies power to the camera 52, the memory 53, the wireless transmitter 55, the antenna 54, and a light source 52b to be described later.

Moreover, the housing 51 is provided with a magnetic (reed) switch 58 for detecting a state in which the capsule endoscope 50 is set in the data reception device. The CPU 56 supplies power from the coil 57 to the wireless transmitter 55 when the reed switch 58 detects the state of being set to the data reception device and data transmission becomes possible.

The camera 52 includes, for example, an image sensor 52a including an objective optical system for capturing an image in the body cavity, and a plurality of the light sources 52b for illuminating the body cavity. Specifically, the camera 52 includes, as the light source 52b, for example, a complementary metal oxide semiconductor (CMOS) sensor or a charge coupled device (CCD), which includes a light emitting diode (LED).

The display unit 2 of the electronic apparatus 1 according to the first to ninth embodiments is a display unit including a light emitting body such as the light source 52b of FIG. 21. The capsule endoscope 50 of FIG. 21 includes, for example, two light sources 52b, but these light sources 52b can be configured by a display panel having a plurality of light source units or an LED module having a plurality of LEDs. In this case, by disposing the imaging unit 4 of the camera 52 below the display panel or the LED module, restrictions on the layout arrangement of the camera 52 are reduced, and the capsule endoscope 50 having a smaller size can be realized.

Figure 22:
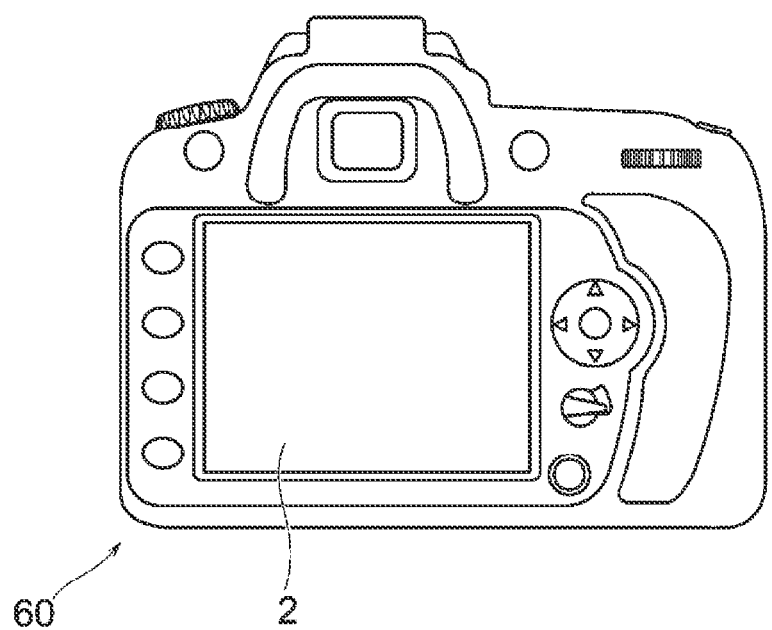
FIG. 22 is a rear view in a case where the electronic apparatus according to the first to ninth embodiments is applied to a digital single-lens reflex camera.

Furthermore, FIG. 22 is a rear view in a case where the electronic apparatus 1 according to the first to ninth embodiments is applied to a digital single-lens reflex camera 60. The digital single-lens reflex camera 60 and a compact camera include the display unit 2 that displays a preview screen on a back surface on an opposite side to the lens. The camera module 3 may be disposed on the opposite side to the display surface of the display unit 2 such that a face image of a photographer can be displayed on the display surface 1a of the display unit 2. In the electronic apparatus 1 according to the first to ninth embodiments, since the camera module 3 can be disposed in a region overlapping the display unit 2, it is not necessary to provide the camera module 3 in a frame portion of the display unit 2, and the size of the display unit 2 can be increased as much as possible.

Figure 23A:
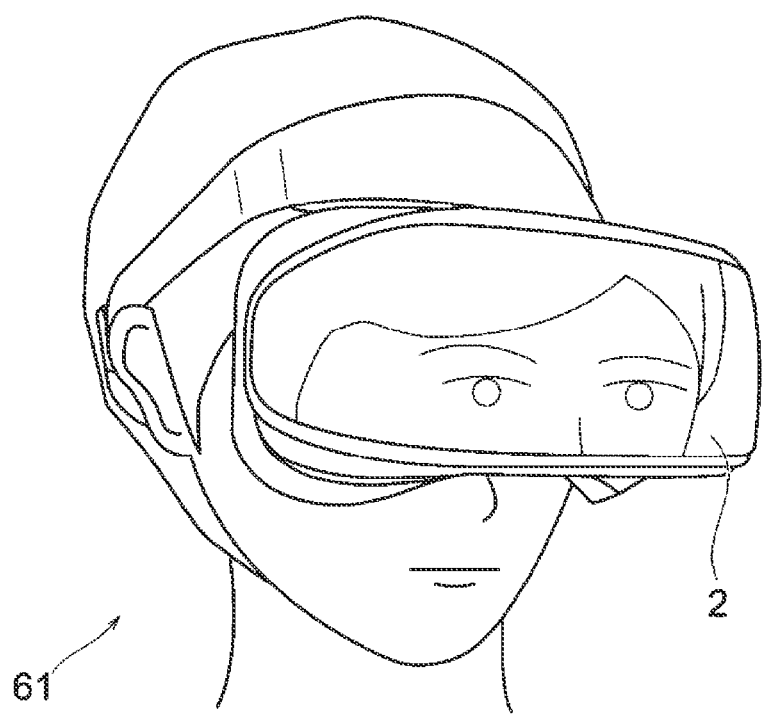
FIG. 23A is a plan view illustrating an example in which the electronic apparatus according to the first to ninth embodiments is applied to an HMD.
Figure 23B:
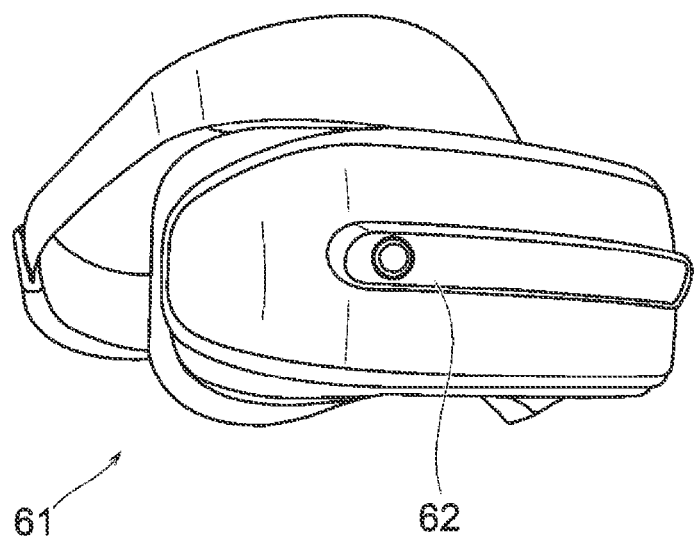
FIG. 23B is a view illustrating a current HMD.

FIG. 23A is a plan view illustrating an example in which the electronic apparatus 1 according to the first to ninth embodiments is applied to a head mounted display (HMD) 61. The HMD 61 of FIG. 23A is used for virtual reality (VR), augmented reality (AR), mixed reality (MR), substitutional reality (SR), and the like. As illustrated in FIG. 23B, in the current HMD, a camera 62 is mounted on the outer surface, and the wearer of the HMD can visually recognize the surrounding image, but there is a problem that the surrounding people cannot recognize the expression of eyes or a face of the wearer of the HMD.

Therefore, in FIG. 23A, the display surface of the display unit 2 is provided on the outer surface of the HMD 61, and the camera module 3 is provided on the opposite side to the display surface of the display unit 2. Therefore, the expression of the face of the wearer, which is imaged by the camera module 3, can be displayed on the display surface of the display unit 2, and the people around the wearer can grasp the expression of the face of the wearer and the movement of the eyes of the wearer in real time.

In the case of FIG. 23A, since the camera module 3 is provided on the back surface side of the display unit 2, there is no restriction on the installation location of the camera module 3, and the degree of freedom in design of the HMD 61 can be increased. Furthermore, since the camera can be disposed at an optimum position, it is possible to prevent problems such as misalignment of the eyes of the wearer displayed on the display surface.

As described above, in the tenth embodiment, the electronic apparatus 1 according to the first to ninth embodiments can be used for various applications, and a utility value can be increased.

Note that the present technology can also have the following configurations.

(1) An electronic apparatus including:
a display unit;
an imaging unit that is disposed on an opposite side to a display surface of the display unit;
an abnormality detection unit that detects an abnormality on the display surface; and
a display control unit that highlights a position where the abnormality detected by the abnormality detection unit occurs on the display unit.

(2) The electronic apparatus according to (1), in which the display control unit causes the display unit to display information urging removal of the abnormality.

(3) The electronic apparatus according to (2), in which the information includes information corresponding to a type of the abnormality.

(4) The electronic apparatus according to any one of (1) to (3), in which the display control unit causes the display unit to display an indicator indicating the position where the abnormality occurs.

(5) An electronic apparatus including:
a display unit that is capable of emitting light at a plurality of different emission wavelengths;
an imaging unit that is disposed on an opposite side to a display surface of the display unit; and
an abnormality detection unit that detects an abnormality on the display surface on the basis of a plurality of images captured by the imaging unit in a state in which at least a part of the display surface is caused to emit light at each of the plurality of emission wavelengths.

(6) The electronic apparatus according to (5), in which the abnormality detection unit detects the abnormality on the display surface on the basis of a plurality of images captured by the imaging unit in a state in which a region overlapping with an angle of view of the imaging unit on the display surface is caused to emit light at each of the plurality of light emission wavelengths.

(7) An electronic apparatus including:
a display unit;
an imaging unit that is disposed on an opposite side to a display surface of the display unit;
an abnormality detection unit that detects an abnormality on the display surface; and
a correction processing unit that corrects an image captured by the imaging unit on the basis of the abnormality.

(8) The electronic apparatus according to (7), in which the correction processing unit corrects the image captured by the imaging unit on the basis of information regarding at least one of a type of the abnormality, a color of the abnormality, a size of the abnormality, a position of the abnormality, or the number of the abnormalities.

(9) The electronic apparatus according to (8) or (9), further including an abnormality determination unit that determines a type of the abnormality,
in which the correction processing unit performs correction processing according to the type of the abnormality determined by the abnormality determination unit on the image captured by the imaging unit.

(10) The electronic apparatus according to (9), in which the correction processing includes at least one of edge emphasis processing, distortion correction processing, or scratch correction processing.

(11) The electronic apparatus according to any one of (7) to (10), further including a model generation unit that generates a model correcting the image captured by the imaging unit on the basis of information regarding the abnormality, the model being trained on the basis of at least one piece of information regarding a type of the abnormality, a color of the abnormality, a size of the abnormality, a position of the abnormality, or the number of the abnormalities, and an image before and after the correction processing unit performs correction,
in which the correction processing unit corrects the image captured by the imaging unit by giving the image captured by the imaging unit and the information regarding the abnormality to the trained model.

(12) The electronic apparatus according to any one of (7) to (11), further including:
a correction determination unit that determines whether or not correction by the correction processing unit is effective;
an image communication unit that transmits the image captured by the imaging unit and information regarding the abnormality to an information processing apparatus and receives the image corrected by the information processing apparatus in a case where it is determined that the correction by the correction processing unit is not effective; and
an output unit that outputs the image corrected by the information processing apparatus.

(13) The electronic apparatus according to any one of (7) to (12), in which the imaging unit includes a plurality of cameras that captures images at different angles of view, and
the correction processing unit removes the abnormality from the image captured by the imaging unit on the basis of a plurality of the images captured by the plurality of cameras.

(14) The electronic apparatus according to any one of (1) to (13), in which
the imaging unit includes
a plurality of photoelectric conversion units that photoelectrically converts light incident through the display unit,
at least one of the plurality of photoelectric conversion units is capable of detecting phase difference information, and
the abnormality detection unit detects the abnormality on the basis of the phase difference information.

(15) The electronic apparatus according to any one of (1) to (13), in which the imaging unit includes:
a plurality of photoelectric conversion units that photoelectrically converts light incident through the display unit; and
a plurality of polarization elements that is disposed on a light incident side of at least one of the plurality of photoelectric conversion units, and
the abnormality detection unit detects the abnormality on the basis of polarization information polarized by the plurality of polarization elements and photoelectrically converted by the photoelectric conversion units.

(16) The electronic apparatus according to (15), in which the plurality of polarization elements includes a plurality of types of polarization elements that detects different polarization states.

(17) The electronic apparatus according to any one of (1) to (16), in which
the imaging unit includes:
a plurality of photoelectric conversion units that photoelectrically converts light incident through the display unit; and
a microlens array that forms an image of object light on the plurality of photoelectric conversion units.

(18) The electronic apparatus according to any one of (1) to (13), further including a distance detection unit that detects a distance to an object imaged by the imaging unit,
in which the abnormality detection unit detects the abnormality on the basis of the distance detected by the distance detection unit.

(19) The electronic apparatus according to (18), in which the imaging unit includes a plurality of cameras that captures images at different angles of view, and
the distance detection unit detects the distance on the basis of the captured images of the plurality of cameras.

(20) The electronic apparatus according to any one of (1) to (19), further including a fingerprint detection unit that detects a fingerprint of a finger brought into contact with the display surface on the basis of an image captured by the imaging unit.

Aspects of the present disclosure are not limited to the above-described embodiments, but include various modifications that can be conceived by those skilled in the art, and the effects of the present disclosure are not limited to the above-described contents. That is, various additions, modifications, and partial deletions can be made without departing from the conceptual idea and spirit of the present disclosure derived from the contents defined in the claims and equivalents thereof.

REFERENCE SIGNS LIST

1 Electronic apparatus
1a Display surface
1b Bezel
2 Display unit
2b Protective film
2c Polyimide substrate
2d Display layer
2e Barrier layer
2f Touch sensor layer
2g Adhesive layer 2h Circular polarization plate
2i Optical clear adhesive
2p Abnormality
2q Indicator
2r Film
3 Camera module
4 Imaging unit
4a Photoelectric conversion unit
5 Optical system
11 Semiconductor substrate
12 Element separation layer
13 Flattening layer
14 Color filter layer
15 On-chip lens
16 Readout circuit
17 Interlayer insulation film
21 Imaging device
22 Application processor
23 Image signal generation unit
24 A/D conversion unit
25 Display control unit
31 A/D conversion unit
32 Signal processing unit
32a Clamp unit
32b Color output unit
32c Defect correction unit
32d Linear matrix unit
32e Gamma correction unit
32f Luminance/chroma signal generation unit
32g Noise reduction unit
32h Edge emphasis unit
33 Imaging control unit
34 Exposure adjustment unit
35 Abnormality detection unit
36 Output unit

The invention claimed is:

1. An electronic apparatus comprising:
a display;
an image that is disposed on an opposite side to a display surface of the display;
an abnormality detection unit that detects an abnormality on the display surface; and
a display controller that highlights a position where the abnormality detected by the abnormality detection unit occurs on the display, wherein
the imager includes a plurality of photoelectric conversion units that photoelectrically converts light incident through the display,
at least one of the plurality of photoelectric conversion units is configured to detect phase difference information, and
the abnormality detection unit detects the abnormality on a basis of the phase difference information.

2. The electronic apparatus according to claim 1, wherein the display controller causes the display to display information urging removal of the abnormality.

3. The electronic apparatus according to claim 2, wherein the information includes information corresponding to a type of the abnormality.

4. The electronic apparatus according to claim 1, wherein the display controller causes the display to display an indicator indicating the position where the abnormality occurs.

5. The electronic apparatus according to claim 1, wherein the image includes a microlens array that forms an image of object light on the plurality of photoelectric conversion units.

6. The electronic apparatus according to claim 1, further comprising a distance detection unit that detects a distance to an object imaged by the image, wherein
the abnormality detection unit detects the abnormality on a basis of the distance detected by the distance detection unit.

7. The electronic apparatus according to claim 6, wherein
the image includes a plurality of cameras that captures images at different angles of view, and
the distance detection unit detects the distance on a basis of the captured images of the plurality of cameras.

8. The electronic apparatus according to claim 1, further comprising a fingerprint detection unit that detects a fingerprint of a finger brought into contact with the display surface on a basis of an image captured by the image.

9. An electronic apparatus comprising:
a display;
an image that is disposed on an opposite side to a display surface of the display;
an abnormality detection unit that detects an abnormality on the display surface;
a correction processing unit that corrects an image captured by the image on a basis of the abnormality;
a model generation unit that generates a model correcting the image captured by the imager on a basis of information regarding the abnormality, the model being trained on a basis of at least one piece of information regarding a type of the abnormality, a color of the abnormality, a size of the abnormality, a position of the abnormality, or a number of abnormalities, and an image before and after the correction processing unit performs correction, wherein
the correction processing unit corrects the image captured by the imager by giving the image captured by the imager and the information regarding the abnormality to the trained model.

10. The electronic apparatus according to claim 9, wherein
the correction processing unit corrects the image captured by the image on a basis of information regarding at least one of a type of the abnormality, a color of the abnormality, a size of the abnormality, a position of the abnormality, or the number of abnormalities.

11. The electronic apparatus according to claim 10, further comprising an abnormality determination unit that determines a type of the abnormality, wherein
the correction processing unit performs correction processing according to the type of the abnormality determined by the abnormality determination unit on the image captured by the image.

12. The electronic apparatus according to claim 11, wherein
the correction processing includes at least one of edge emphasis processing, distortion correction processing, or scratch correction processing.

13. The electronic apparatus according to claim 9, wherein
the image includes a plurality of cameras that captures images at different angles of view, and
the correction processing unit removes the abnormality from the image captured by the image on a basis of a plurality of the images captured by the plurality of cameras.

14. An electronic apparatus comprising:
a display;
an imager disposed on an opposite side to a display surface of the display;

an abnormality detection unit that detects an abnormality on the display surface;

a correction processing unit that corrects an image captured by the imager on a basis of the abnormality;

a correction determination unit that determines whether or not correction by the correction processing unit is effective;

an image communication unit that transmits the image captured by the image and information regarding the abnormality to an information processing apparatus and receives the image corrected by the information processing apparatus in a case where it is determined that the correction by the correction processing unit is not effective; and an output configured to output the image corrected by the information processing apparatus.

15. An electronic apparatus comprising:

a display;

an imager that is disposed on an opposite side to a display surface of the display;

an abnormality detection unit that detects an abnormality on the display surface; and a display controller that highlights a position where the abnormality detected by the abnormality detection unit occurs on the display, wherein the image includes:
  a plurality of photoelectric conversion units that photoelectrically converts light incident through the display; and
  a plurality of polarization elements that is disposed on a light incident side of at least one of the plurality of photoelectric conversion units, and
  the abnormality detection unit detects the abnormality on a basis of polarization information polarized by the plurality of polarization elements and photoelectrically converted by the photoelectric conversion units.

16. The electronic apparatus according to claim 15, wherein the plurality of polarization elements includes a plurality of types of polarization elements that detects different polarization states.

17. An electronic apparatus comprising:

a display;

an imager that is disposed on an opposite side to a display surface of the display;

a memory storing a program; and at least one processor configured to execute the program to perform operations comprising:

detecting an abnormality on the display surface, and highlighting a position where the abnormality occurs on the display, wherein the imager includes a plurality of photoelectric conversion units that photoelectrically convert light incident through the display, at least one of the plurality of photoelectric conversion units is configured to detect phase difference information, and detecting the abnormality is performed on a basis of the phase difference information.

18. An electronic apparatus comprising:

a display;

an imager disposed on an opposite side to a display surface of the display;

an abnormality detection unit that detects an abnormality on the display surface;

a memory storing a program; and at least one processor configured to execute the program to perform operations comprising:

correcting an image captured by the imager on a basis of the abnormality, generating a model correcting the image captured by the imager on a basis of information regarding the abnormality, the model being trained on a basis of at least one piece of information regarding a type of the abnormality, a color of the abnormality, a size of the abnormality, a position of the abnormality, or a number of abnormalities, and an image before and after correction, and correcting the image captured by the imager by giving the image captured by the imager and the information regarding the abnormality to the trained model.

19. An electronic apparatus comprising:

a display;

an imager disposed on an opposite side to a display surface of the display;

a memory storing a program; and at least one processor configured to execute the program to perform operations comprising:

detecting an abnormality on the display surface, correcting an image captured by the imager on a basis of the abnormality, determining whether or not correcting the image is effective, transmitting the image captured by the imager and information regarding the abnormality to an information processing apparatus and receiving the image corrected by the information processing apparatus in a case where it is determined that correcting the image is not effective, and outputting the image corrected by the information processing apparatus.

20. An electronic apparatus comprising:

a display;

an imager that is disposed on an opposite side to a display surface of the display, the imager including a plurality of photoelectric conversion units that photoelectrically converts light incident through the display, and a plurality of polarization elements disposed on a light incident side of at least one of the plurality of photoelectric conversion units;

a memory storing a program; and at least one processor configured to execute the program to perform operations comprising:

detecting an abnormality on the display surface, highlighting a position where the abnormality occurs on the display, and detecting the abnormality on a basis of polarization information polarized by the plurality of polarization elements and photoelectrically converted by the photoelectric conversion units.

* * * * *